United States Patent
Banna et al.

(10) Patent No.: US 12,322,618 B2
(45) Date of Patent: Jun. 3, 2025

(54) ADAPTIVE CONTROL OF VARIABILITY IN DEVICE PERFORMANCE IN ADVANCED SEMICONDUCTOR PROCESSES

(71) Applicant: Applied Materials, Inc., Santa Clara, CA (US)

(72) Inventors: Samer Banna, San Jose, CA (US); Lior Engel, Sunnyvale, CA (US); Dermot Cantwell, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 604 days.

(21) Appl. No.: 17/182,119

(22) Filed: Feb. 22, 2021

(65) Prior Publication Data

US 2021/0175104 A1 Jun. 10, 2021

Related U.S. Application Data

(63) Continuation of application No. 16/155,779, filed on Oct. 9, 2018, now Pat. No. 10,930,531.

(51) Int. Cl.
*H01J 37/32* (2006.01)
*G05B 13/02* (2006.01)
(Continued)

(52) U.S. Cl.
CPC .... *H01L 21/67253* (2013.01); *G05B 13/0265* (2013.01); *G05B 13/048* (2013.01);
(Continued)

(58) Field of Classification Search
None
See application file for complete search history.

(56) References Cited

U.S. PATENT DOCUMENTS 6,388,253 B1 5/2002 Su
6,858,361 B2 2/2005 Mui et al.
(Continued)

FOREIGN PATENT DOCUMENTS

CN 1799045 A 7/2006
CN 104900549 A 9/2015
(Continued)

OTHER PUBLICATIONS

International Search Report and Written Opinion for PCT Patent Application No. PCT/US2019/055031, dated Jan. 23, 2020, 13 pages.

*Primary Examiner* — Hsien Ming Lee
(74) *Attorney, Agent, or Firm* — Lowenstein Sandler LLP

(57) ABSTRACT

Systems and methods for controlling device performance variability during manufacturing of a device on wafers are disclosed. The system includes a process platform, on-board metrology (OBM) tools, and a first server that stores a machine-learning based process control model. The first server combines virtual metrology (VM) data and OBM data to predict a spatial distribution of one or more dimensions of interest on a wafer. The system further comprises an in-line metrology tool, such as SEM, to measure the one or more dimensions of interest on a subset of wafers sampled from each lot. A second server having a machine-learning engine receives from the first server the predicted spatial distribution of the one or more dimensions of interest based on VM and OBM, and also receives SEM metrology data, and updates the process control model periodically (e.g., wafer-to-wafer, lot-to-lot, chamber-to-chamber etc.) using machine learning techniques.

20 Claims, 18 Drawing Sheets

(51) Int. Cl.
*G05B 13/04* (2006.01)
*H01L 21/66* (2006.01)
*H01L 21/67* (2006.01)

(52) U.S. Cl.
CPC ........ *H01J 37/32926* (2013.01); *H01L 22/12* (2013.01); *H01L 22/14* (2013.01); *H01L 22/20* (2013.01); *H01L 22/26* (2013.01); *H01J 2237/3341* (2013.01)

(56) References Cited

U.S. PATENT DOCUMENTS

| | | |
|---|---|---|
| 6,910,947 B2 | 6/2005 | Paik |
| 6,913,938 B2 | 7/2005 | Shanmugasundram |
| 6,924,088 B2 | 8/2005 | Mui |
| 6,960,416 B2 | 11/2005 | Mui |
| 7,094,613 B2 | 8/2006 | Mui |
| 7,250,309 B2 | 7/2007 | Mak |
| 7,265,382 B2 | 9/2007 | Lymberopoulos |
| 7,498,106 B2 | 3/2009 | Mui |
| 7,815,812 B2 | 10/2010 | Davis |
| 7,829,471 B2 | 11/2010 | Kumar |
| 7,838,433 B2 | 11/2010 | Kumar |
| 7,902,991 B2 | 3/2011 | Park et al. |
| 9,972,478 B2 | 5/2018 | Guha et al. |
| 10,197,908 B2 | 2/2019 | Sriraman et al. |
| 10,254,641 B2 | 4/2019 | Mailfert et al. |
| 10,440,777 B2 | 10/2019 | Zhang et al. |
| 2001/0051836 A1 | 12/2001 | Lamey, Jr. et al. |
| 2003/0049376 A1 | 3/2003 | Schwarm et al. |
| 2004/0254762 A1* | 12/2004 | Hopkins ........... H01L 21/67276 702/182 |
| 2005/0132306 A1 | 6/2005 | Smith |
| 2008/0076046 A1 | 3/2008 | Willis et al. |
| 2009/0198635 A1 | 8/2009 | Doddi et al. |
| 2009/0276073 A1 | 11/2009 | Guez et al. |
| 2010/0234975 A1 | 9/2010 | Wu et al. |
| 2010/0249976 A1* | 9/2010 | Aharoni ............ G05B 23/0229 700/121 |
| 2012/0239178 A1 | 9/2012 | Wu et al. |
| 2012/0252141 A1 | 10/2012 | Sundararajan et al. |
| 2014/0031968 A1 | 1/2014 | Baseman et al. |
| 2014/0107828 A1 | 4/2014 | Zhu et al. |
| 2014/0282324 A1 | 9/2014 | Greiner et al. |
| 2014/0303912 A1 | 10/2014 | Banerjee et al. |
| 2014/0311968 A1 | 10/2014 | Xiao et al. |
| 2015/0008132 A1 | 1/2015 | Stahl et al. |
| 2017/0193400 A1 | 7/2017 | Bhaskar et al. |
| 2017/0200265 A1 | 7/2017 | Bhaskar et al. |
| 2018/0082826 A1 | 3/2018 | Guha et al. |
| 2018/0275630 A1 | 9/2018 | Kao et al. |
| 2018/0300434 A1 | 10/2018 | Hu et al. |
| 2019/0295906 A1* | 9/2019 | Clark ...................... H01L 22/20 |
| 2020/0090968 A1 | 3/2020 | Van Selow |
| 2020/0091017 A1 | 3/2020 | Musselman |
| 2021/0116818 A1* | 4/2021 | Bastani ............... G03F 7/70525 |

FOREIGN PATENT DOCUMENTS

| | | |
|---|---|---|
| CN | 10753399 A | 1/2018 |
| CN | 108463876 A | 8/2018 |
| JP | 2005-109437 A | 4/2005 |
| JP | 2007528985 A | 10/2007 |
| JP | 2008511986 A | 4/2008 |
| JP | 2017536584 A | 12/2017 |
| KR | 1020140011064 A | 1/2014 |
| KR | 101801023 B1 | 12/2017 |
| WO | 2006025943 A1 | 3/2006 |
| WO | 2017083411 A1 | 5/2017 |
| WO | 2017117568 A1 | 7/2017 |
| WO | 02103777 A1 | 12/2017 |

* cited by examiner

| DoE Input | Step 1 | Step 2 | Step 3 | Step 4 | Step 5 | Step 6 | Step 7 | | | | | |
|---|---|---|---|---|---|---|---|---|---|---|---|---|
| Process Control Variables | Knob 1 | Knob 2 | Knob 3 | Knob 4 | Knob 5 | Knob 6 | Knob 7 | Knob 8 | Knob 9 | Knob 10 | Knob 11 | Knob 12 |
| Upper Value | A+ | B+ | C+ | D+ | E+ | F+ | G+ | H+ | I+ | J+ | K+ | L+ |
| Baseline Value | A | B | C | D | E | F | G | H | I | J | K | L |
| Lower Value | A- | B- | C- | D- | E- | F- | G- | H- | I- | J- | K- | L- |

ADAPTIVE CONTROL OF VARIABILITY IN DEVICE PERFORMANCE IN ADVANCED SEMICONDUCTOR PROCESSES

CROSS REFERENCE TO RELATED APPLICATIONS

This application is a continuation of U.S. application Ser. No. 16/155,779, filed Oct. 9, 2018, the contents of which are entirely incorporated by reference.

TECHNICAL FIELD

The present disclosure generally relates to building a spatial model to predict performance of semiconductor processing equipment, and using the spatial model to converge faster to a desired process during the development phase, and obtain a tight process control during high-volume manufacturing (HVM).

BACKGROUND

Semiconductor wafer processing complexity has been increasing as the device size has been shrinking. A typical process has multiple different steps, with some advanced processes, such as plasma etching, may have twenty or even more steps. Each step has a multitude of knobs associated to optimize performance. Therefore, the space available to tune and optimize a given process is theoretically extremely large.

Process engineers use their experience and expertise to select a preliminary baseline process and fine tune the process based on a limited number of wafers (or portions of wafers, referred to as coupons) dedicated for design of experiment (DoE). The goal of DoE is to tailor the process to achieve desired specification on a wafer. However, dedicating full wafers or portions of wafers for DoE data collection consume valuable resources. Therefore, often the adopted process may be a viable one, but not necessarily the optimum solution.

Another bottleneck is introduced by insufficient in-line precision metrology data. For precision metrology, usually destructive techniques, such as transmission electron microscopy (TEM), are used. However, since TEM is very time consuming, it usually does not generate enough statistical data and adequate coverage across the wafer. Also, TEM cannot be integrated into the production line because it is a destructive technique.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

Aspects of the disclosure describe a system and a method for controlling wafer-to-wafer device performance variability during manufacturing of a device on wafers. The system comprises: a process platform, comprising one or more processing chambers, on-board metrology (OBM) tools, and a first server that stores a machine-learning based process control model. The first server is to receive virtual metrology (VM) data collected from sensors during processing of a current set of wafers in the one or more processing chambers using a current process of record (POR), and, to also receive OBM data produced by the OBM tools by measuring one or more dimensions of interest in a device being fabricated on the wafers, wherein the one or more dimensions of interest are correlated with device performance. Also, the first server is to combine the VM data and the OBM data and to use the process control model to predict, based on the combined data, a spatial distribution of the one or more dimensions of interest. The system further comprises an in-line metrology tool to measure the one or more dimensions of interest on a subset of wafers selected by sampling the current set of wafers to produce reference in-line metrology data corresponding to the current POR. Additionally, the system comprises a second server having a machine-learning engine to receive from the first server the predicted spatial distribution of the one or more dimensions of interest based on VM and OBM, and to also receive from the in-line metrology tool the reference in-line metrology data, wherein the machine-learning engine is to update the process control model periodically by: comparing the predicted spatial distribution of the one or more dimensions of interest with the reference in-line metrology data corresponding to the current POR; and, recommending a new recipe to modify the current POR for the next set of wafers, the new recipe adapting to change in processing conditions between the current set of wafers and the next set of wafers to minimize wafer-to-wafer device performance variability.

A corresponding method performed by the above system is also disclosed.

BRIEF DESCRIPTION OF THE DRAWINGS

The present disclosure will be understood more fully from the detailed description given below and from the accompanying drawings of various implementations of the disclosure.

DETAILED DESCRIPTION

Overview

Figure 1A:
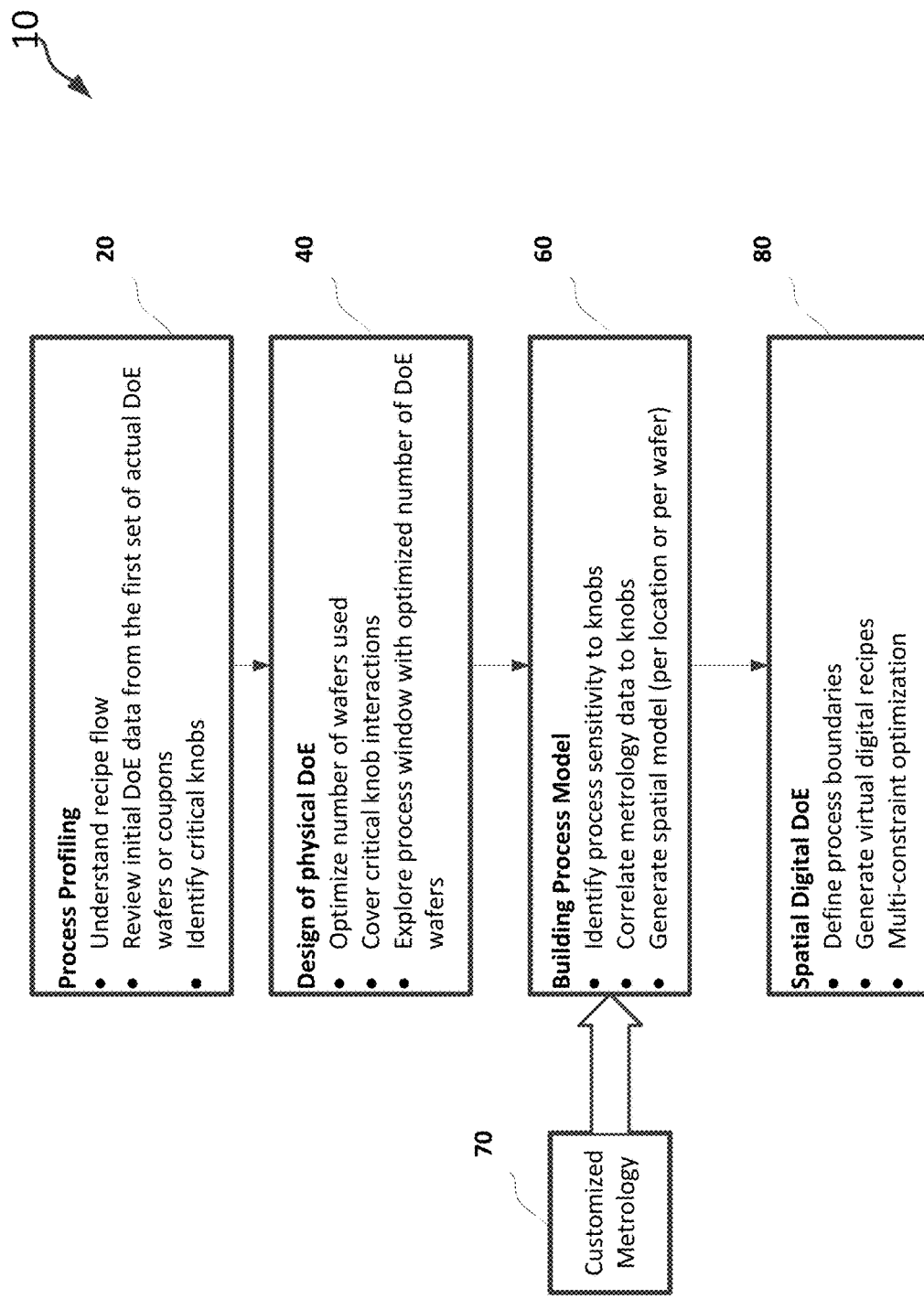
FIG. 1A is a flow diagram of an example method to create a spatial digital design of experiment (DoE), in accordance with some embodiments of the present disclosure.

Aspects of the present disclosure are directed to building a spatial model for predicting performance of semiconductor processing equipment (also referred to as "chamber") using spatial digital DoE. The spatial model is also capable of digitally generating virtual recipes for any set of conditions within a process space. The term "virtual recipe" means a process recipe generated using a spatial digital model of a wafer, i.e. a virtual wafer, rather than a physical wafer or coupon. The term "virtual wafer" encompasses not only wafers, but other objects as well, such as masks to perform mask-based metrology. The spatial model uses machine-learning to leverage the synergy between metrology data and various knobs. The term "knob" is used to indicate variables that can be controlled to control a process. Knobs are sometimes also referred to as process control variables, or simply process variables. The disclosed approach accelerates process qualification for new semiconductor processing equipment and new technology (e.g., 5 nm or lower), covers significantly larger process space that cannot be explored empirically, and identifies process window and its correlation to equipment hardware, final device performance and other process parameters. During the research and development phase, the disclosed systems and methods provide for faster convergence to target process recipes using only a limited number of test wafers. During production ramp leading to high volume manufacturing (HVM), the disclosed systems and methods enables tighter control of the process window not only intra-wafer, but also between wafers in a single lot (wafer-to-wafer control), or between different lots of wafers (lot-to-lot control). The process control frequency and frequency of model adaptation may vary depending on whether it is wafer-to-wafer (higher frequency), lot-to-lot (medium frequency) or PM-to-PM (i.e. once at each periodic maintenance (PM)).

Examples of the semiconductor processing equipment may include, but are not limited to, advanced plasma etchers. As an illustration, a typical plasma etch process may have more than twenty steps, and there may be twenty or more knobs available to control each process step by controlling various process parameters that can be varied (also known as process variables). Examples of process variables for an etch step that can be controlled by an associated knob may include plasma radio frequency (RF) power, pressure, temperature, composition and proportion of gases in the gas mixtures used to generate the plasma etc. The settings of the knobs affect density of radicals or ions in plasma and other factors that define the process. Persons skilled in the art would readily appreciate that the process space available to tune and optimize a given process is extremely large and it is practically impossible to explore the entire process space empirically within any reasonable process qualification time frame, let alone being able to perform multi-dimensional process space optimization as an abstract concept Furthermore, due to the interaction between the knobs and their impact on the process performance, it is extremely hard to predict the combined effect of simultaneous knob control by manually scanning one knob at a time. This task becomes even more complicated for a large number of steps in a single process, or when multiple processes (each process having its associated steps) are involved.

Process engineers recognize that huge windows of operation cannot be covered by manual optimization. However, to achieve acceptable levels of performance, process engineers rely on prior experience to choose an initial process based on existing knowledge, and adjust a few knobs (i.e. fewer than a full set of available knobs) within a process space in an attempt to control variation of one or more feature-level dimensions of interest. The knowledge-based initial process may be a baseline process, but does not have to be a baseline process.

One of the advantages of the present disclosure is that it complements and expands the capability of process engineers significantly by enabling machine-learning-based intelligent process optimization, allowing digital scanning of a large set of knobs across the entire process space. Initially, a model is built using metrology data from diverse sources, e.g., on-tool metrology, and off-tool metrology. This model is used for process optimization during the research and development phase. Later, the model is used to maintain and control a tight process window during high volume manufacturing.

On-tool metrology can include measurements performed on the devices themselves within a die or on test structures having features similar to the devices. Depending on the measurement techniques used, the test structures may include, but are not limited to, structures similar to logic or memory devices that are on the wafers. Collectively, on-tool metrology performed on devices or test structures is referred to as "on-board metrology" (OBM). OBM can be based on optical measurements (e.g., collecting optical emission spectra in-situ from devices or test structures, or macro 2D mapping using optical targets) or other types of measurements. These optical or other measurements can be inside the chamber (in-situ), or outside the chamber (ex-situ), but still under vacuum, or, at the factory interface (not necessarily under vacuum) on a process platform that may have multiple chambers. One such example is integrated metrology, such as optical critical dimension (OCD). The term "platform" broadly encompasses a system including multiple process and/or metrology tools which are all identical or some of the tools may be different from the others. For example a platform may have multiple process chambers performing the same process, or may have some chambers where one process (e.g., etch) is performed, and other chambers where a different process (e.g. deposition) is performed. In some other embodiments, a platform may include different types of process chambers (e.g., conductor or dielectric etch). A platform may also include metrology tools. Persons skilled in the art would appreciate that the scope of the disclosure is not limited by the configuration of the chamber and/or the platform.

Another type of on-tool metrology is referred to as "virtual metrology" (VM), which includes data collected from various sensors in the chamber or outside the chamber, but within the same platform. VM can include time traces of various process variables, such as pressure, temperature, RF power, current, voltage, flow control position etc.

Off-tool metrology may include in-line metrology (e.g., e-beam inspection and metrology). "In-line metrology" broadly encompasses measurements that may be performed outside of a processing chamber, but without having to take the wafer out of the production line. An example of in-line metrology is scanning electron microscope (SEM), the advanced versions of which may offer high precision and broad modality. Advanced SEMs may include back-scattered electron (BSE) sensors in addition to secondary emission detectors, and ability to measure electron emission at various tilt angles and various landing energy, ranging from hundreds of electron-volt to tens of kilo electron-volts. SEMs have the capability of creating a broad database of metrology data in a non-destructive manner. SEM-based in-line metrology customized with e-beam simulation, data collection, image characterization and feature extraction as well as statistical analysis may be referred to as "customized metrology." Advanced SEM tool may be used as the foundation of high-precision, non-destructive three-dimensional feature level profiling which is at the heart of customized metrology.

Off-tool metrology may also include data available from any additional non-inline or off-line metrology, such as TEM, previously performed on a similar set of devices. These on-tool and off-tool metrology is performed on a finite number of wafers dedicated for DoE. The model uses machine-learning algorithms to combine all the data and extract meaningful relationships between metrology of dimensions of interest and various knobs that control the process. As discussed further below, machine-learning may also be used to correlate electrical test data (such as data for parametric yield estimation) with the various knobs.

Once the machine-learning-based spatial model is tested and validated, the model is used for developing an optimized process for actual production wafers. At this stage, dedicated physical DoE wafers may not be required. Rather, the model is used to perform spatial digital DoE, covering the full set of knobs being varied across an entire process space.

Building and Establishing Spatial Model

At the heart of the disclosure is building an empirical spatial model using machine-learning techniques to predict the variability of one or more dimensions of interest across a full wafer or a portion of a wafer. The term "spatial" refers to multiple sites across a wafer, e.g., at the center of the wafer, at an edge of the wafer etc. Typical number of sites may vary from tens to thousands. The dimensions of interest may be geometrical dimensions of physical features on the wafer, e.g., a line width, a height of a structure, a sidewall angle, a top critical dimension (TCD), a bottom critical dimension (BCD) or any other feature-level three-dimensional profile information. However, the scope of the disclosure is not limited to only spatial distribution of geometrical dimensions. Non-limiting examples of spatial process measures include distribution of doping concentration of certain species across the wafer, porosity across the wafer etc. Metrology can be a powerful tool for measuring spatial process variation also.

FIG. 1A is a flow diagram of an example method 10 to enable creation and use of a spatial model, in accordance with some embodiments of the present disclosure. The method 10 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the processes in method 10 or other methods described below with illustrative flowcharts can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Referring back to FIG. 1A, at block 20, the process is profiled. Process profiling involves understanding the recipe structure to achieve certain dimensions and profiles of a device fabricated on a wafer. A finite number of DoE wafers or coupons (a first set of DoE wafers) are subjected to an actual DoE process around a given baseline recipe. The number of actual DoE wafers or coupons may vary depending on the number of knobs to be used for a recipe.

A preliminary DoE screening may be done based on experience of the process engineers. To illustrate preliminary DoE screening, consider an example plasma etch process having more than 10 steps and more than 20 knobs for each step. This process may generate hundreds of millions of recipe combinations. The number of combinations can be reduced using a preliminary DoE screening and process knowledge. By doing a preliminary DoE screening, fewer than a full set of knobs are identified across the recipe space. In short, at block 20, upon reviewing data from the actual wafer or coupons, the critical knobs, i.e. the knobs that have the most effect on the dimensions of interest, are identified.

At block 40, referred to as physical DoE design, the number of actual wafers used can be optimized. In accordance with one of the embodiments, definitive screening or other statistical techniques (e.g., surface response or others) can be used to identify first-order dependency and interaction between different knobs and/or which knobs are orthogonal. In short, at block 40, DoE is designed to cover critical knob interactions identified in block 20, and a process window around the baseline recipe is explored. For example, for 15 identified critical knobs, DoE is designed with 50 or so actual wafers. However, even after reduction of process steps and knobs achieved by definitive screening or other techniques, there remains a huge process space to cover, which the spatial digital DoE model of this disclosure aims to solve.

At block 60, a process model is built. The model is built based on the following building blocks: 1) a machine-learning engine that processes on-tool and off-tool customized metrology data 70 from a finite set of actual DoE wafers; 2) input based on fundamental understanding of process equipment (e.g. reactor) design and physics and chemistry of the process within the equipment (e.g. properties and behavior of plasma within the reactor); 3) input based on equipment hardware specification and allowed range of operation (including process recipe creation rules); and 4) a penalty function quantifying the confidence level in the model's prediction.

Without the input constraints from the process equipment, the process itself, and the penalty function, the machine-learning engine can generate a large number of mathematically viable solutions that may not be compatible with the specific semiconductor processing equipment. Hence, deep knowledge of process physics and chemistry, equipment design and processing experience are critical for the process model to provide tailored solution, rather than merely crunching the massive data available from metrology.

During the process model's training phase, a subset of the physical DoE wafers (e.g. 20-100 wafers) is processed using a finite number of recipes around the baseline recipe. In one example, at least three recipes are chosen. One of the chosen recipes may be exactly identical to the identified baseline recipe. The processed wafers are then characterized using different on-tool and off-tool metrology data, as discussed above. Goals of the process model include, uncovering process sensitivity to knobs, find metrology to knob correlation, and ultimately to generate a spatial model. The spatial model can be per site, i.e. per location on the wafer, or a final spatial model that aggregates the results of all the locations on the wafer. Step 60 of FIG. 1A can be implemented by the system 100 in FIG. 1B.

Next at block 80, the spatial model is used to create a spatial digital DoE space within the process boundaries. As discussed below, the model can generate virtual recipe without using physical wafers. The model performs multi-constraint optimization to come up with a recipe space that meets the desired dimensional specifications.

Figure 1B:
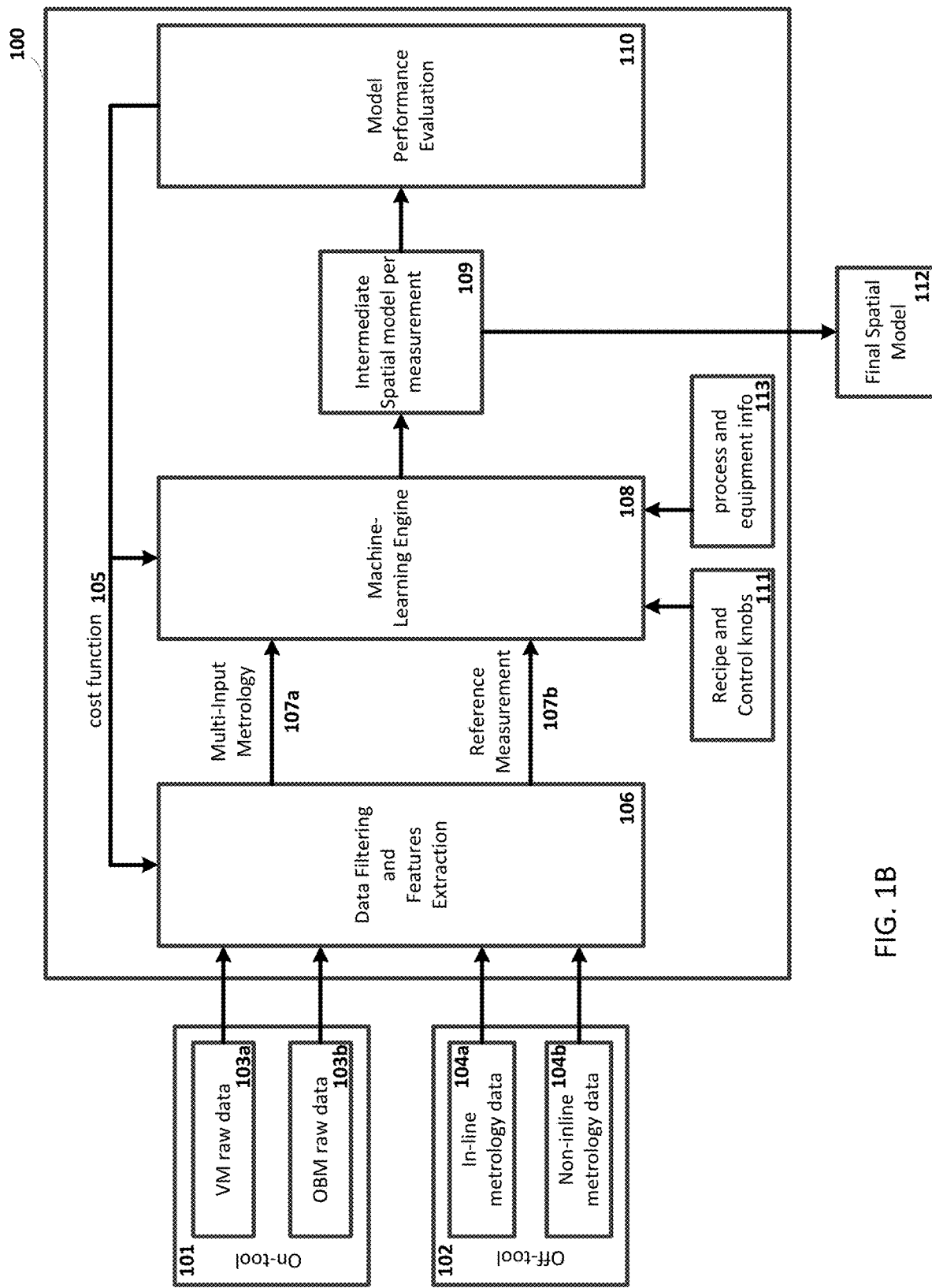
FIG. 1B is a block diagram of a machine-learning based spatial model generator, according to an embodiment of this disclosure.

FIG. 1B shows a system 100 that outputs a final spatial model 112. Input to the system 100 includes characterization data from physical DoE wafers using recipes around a baseline recipe. Characterization data includes on-tool metrology data 101, including VM raw data 103*a* and OBM raw data 103*b*, as well as off-tool data 102, including in-line metrology data 104*a* and non-inline metrology data 104*b*.

The characterization data is then fed to the machine-learning engine 108. The data is filtered by an additional data filtering and features extraction module 106 that precedes the machine-learning engine 108. The module 106 is a key module that extracts meaningful features from the data set and draw inference to optimize machine-learning engine performance. The output of module 106 is multi-input metrology data 107*a* (derived from on-tool and off-tool metrology data) from the currently used DoE wafers. The output of module 106 may also have some reference measurements 107*b* obtained from previous trustworthy measurements. These reference measurements (sometimes called "golden profile") may not be used during spatial model building and process optimization phase, but are often used during subsequent run-time process control.

The machine-learning method used by the machine-learning engine 108 can be based on neural network, deep learning or any other known techniques used for regression analysis (e.g., linear, partial least squares, Gaussian, polynomials, convolution neural networks for regression, regression trees and others). In addition to metrology data, the machine-learning engine 108 also receives information 111 about various recipes and knobs, as well as information 113 about the process and the equipment. The machine-learning engine 108 then generates intermediate spatial model 109 for each measurement on the wafer. Each measurement can have data about one or more dimensions of interest. The model's performance is evaluated by the evaluation module 110. The model's performance is optimized using a penalty function or cost function 105, such as root mean square error (rMSE) or any other suitable metric. The cost function is sometimes referred to as "objective function," designed to allow optimization of one or more dimensions of interest. The cost function can be for each location on a wafer, or just one cost function for an entire wafer. Cost function can also be for each DoE condition. Optimization routines (including, but not limited to swarm optimization or swarm variants, are designed to minimize non-convex multi-minima hyper-surfaces. Error penalties or regularization terms may be added to the cost function to find higher probability solutions in high dimension non-convex multi-minima hyper-surfaces. Once the desired value of the cost function is obtained, the spatial model may be further validated using metrology data from another set of physical DoE wafers. Number of test and validation wafers may be in the range of tens or twenties, but may vary. Depending on how a cost function is chosen, the test and validation process can be repeated spatially for each data point across a wafer for which metrology was conducted. Alternatively, the spatial model can be optimized to achieve an average dimensional uniformity across the wafer. The final spatial model 112 can combine results from all the data points on the wafer for which metrology was conducted.

Once the spatial model is established, one can determine process sensitivity of knobs for one or both of a mean value of a dimension of interest across the wafer and range of that value across the wafer. Such sensitivity outcome provides great insight to process engineers while developing a new process, helping them to understand how the interaction between different knobs affects the performance. Furthermore, it allows isolating the contribution of each knob on its own and the collective effect of various combinations of the knobs. Multiple (typically three or more) repeats of the baseline process are included in the DoE to capture process variability and metrology variability.

With knowledge of sensitivity of control knobs garnered from the metrology data, there is a limited need to use actual wafers. This phase is called the "digital" DoE phase, where process optimization happens mostly in the virtual domain. Note that the outcome of the digital DoE is a spatial model of the wafer, therefore the digital DoE is also referred to as the spatial digital DoE. Extremely large number of spatial digital DoEs can be performed, for example tens of thousands or more, to get statistically viable distribution. Once a process space is established through the spatial digital DoE, one can identify a stable processing condition without the need to run real wafers. The process model can also work in the "inverse spatial" mode, i.e. the process model takes trustworthy reference dimensions across the wafer as input, and almost immediately suggests virtual recipes that would give predictable performance within the desired process window. It is possible to optimize in spatial mode and the inverse spatial mode in parallel or in series. Also, even if the model is used to perform spatial digital DoE, a limited number of physical DoE wafers may be actually processed to test the efficacy of the results predicted by the model.

Figure 2:
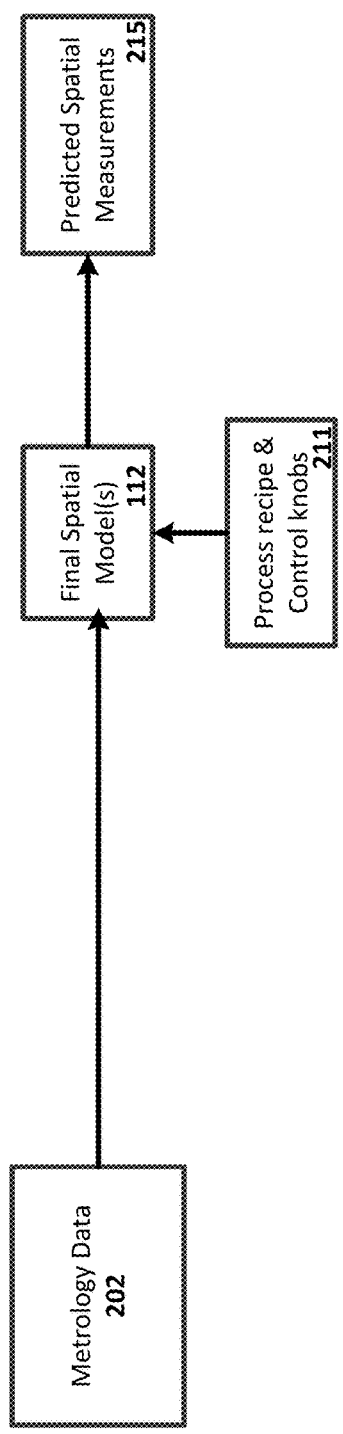
FIG. 2 and FIG. 3 show two fundamental capabilities of the model, predicting spatial measurement and recommending recipes, according to embodiments of the present disclosure.
Figure 3:
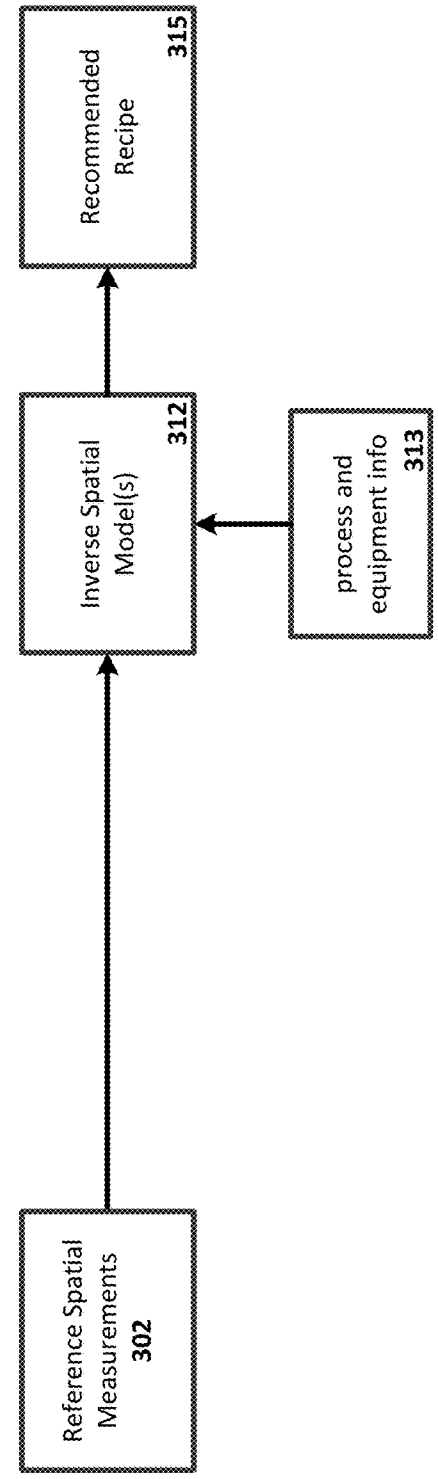

FIG. 2 and FIG. 3 show the two basic capabilities of the machine-learning based model. When metrology data 202 is used to generate final spatial model(s) 112, the machine-learning based model can predict spatial dimensions of interest 215 based on various process recipes and control knob information 211. On the other hand, when reference spatial measurements (sometimes called "golden profiles") 302 are used as input, an inverse spatial model 312 can recommend recipe 315 for a given process and given equipment (chosen from a database of processes and equipment) when the process/equipment information 313 is fed to the inverse spatial model 312. One or both of these two capabilities can be used during the model training and calibration phase as well as during run-time wafer-to-wafer variability control phase. Spatial measurement prediction is more useful during the calibration process, and recipe prediction is more useful during the wafer-to-wafer control phase (for example, maintaining and/or optimizing a process of record (POR) for the HVM phase), as discussed further below in the specification.

The spatial model allows process engineers to define multiple constraints (i.e. process specifications) on the process performance, such as a desired spatial profile per dimension across the wafer, a desired uniformity range, a desired mean value across the wafer etc. This is referred to a multi-input multi-output (MIMO) process optimization.

Figures 4, 5A:
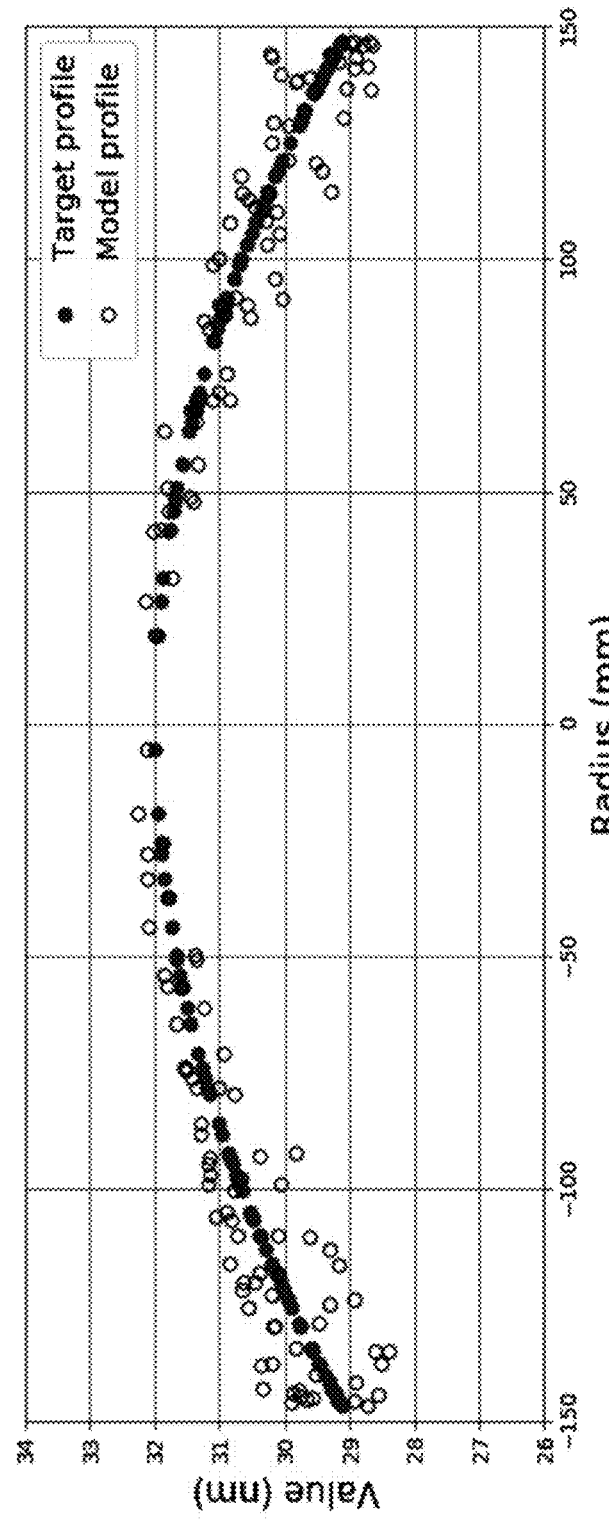
FIG. 4 shows an example DoE space for a multi-step process, each step having one or more knobs, according to embodiments of the present disclosure.
FIG. 5A shows comparison of a target profile of a dimension of interest and the prediction of the spatial model, according to an embodiment of this disclosure.

FIG. 4 shows exemplary DoE range based on a typical process recipe in accordance with an embodiment of the present disclosure. The DoE varies multiple process variables during a sequence of different process steps. The variables are tuned within a band around a baseline recipe. For example, variable 1 is varies between an upper value A+ and a lower value A− around a baseline value A.

FIG. 5A shows a plot of a certain dimension of interest across a wafer. The solid circles represent the target profile of the dimension of interest, while the clear circles represent the profile predicted by the spatial model of the present disclosure.

Figure 5B:
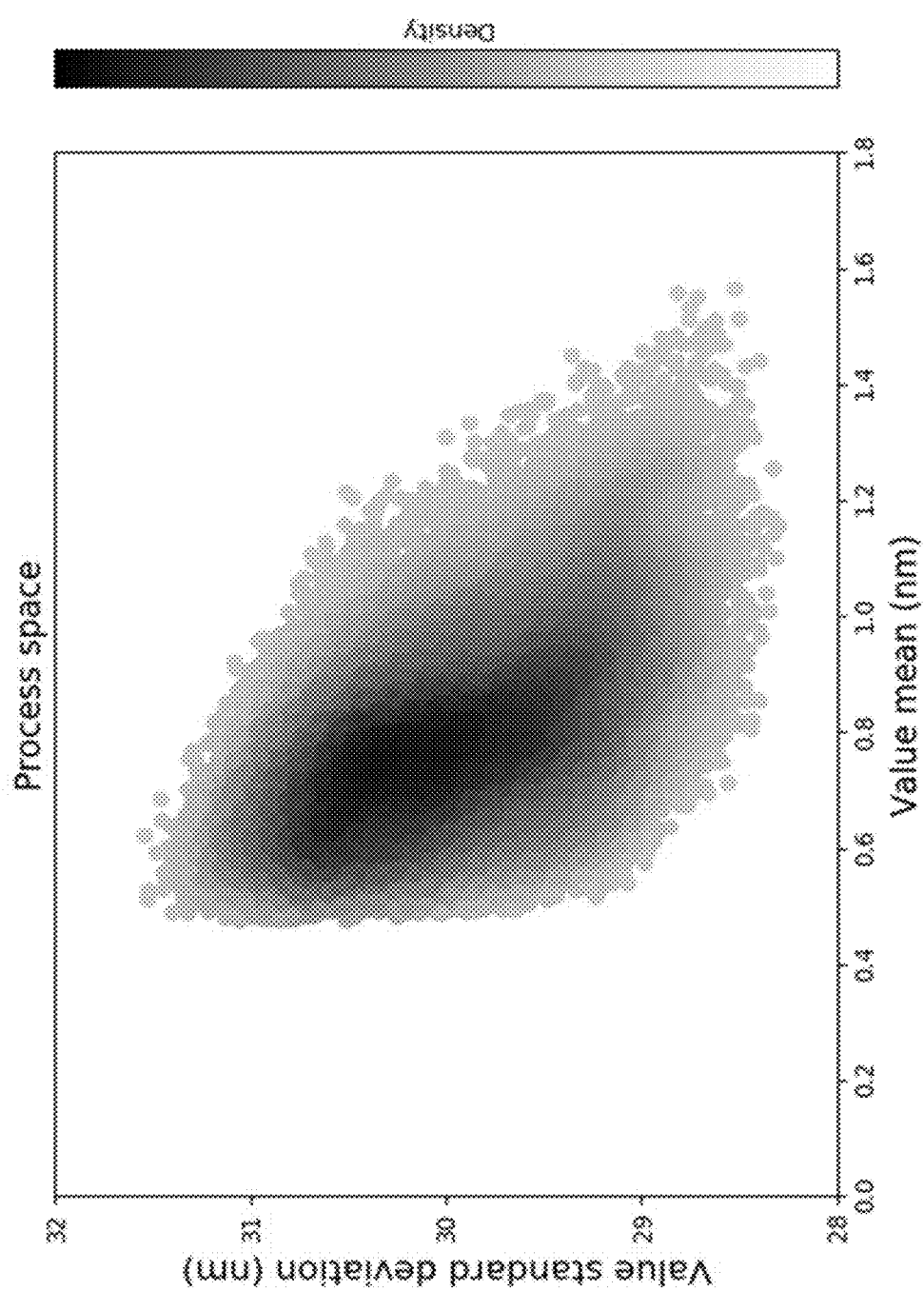
FIG. 5B shows a plot of a dimension of interest at different process conditions, predicted by the spatial digital DoE, according to an embodiment of this disclosure.

FIG. 5B shows a plot of a dimension of interest D1 at different process conditions within a process space, as predicted by the spatial digital DoE. Each dot on the plot represents a process condition. X-axis of the plot is mean value of the dimension of interest D1 across wafer, and Y-axis of the plot is standard deviation. Each point on FIG. 5B indicates a combination of knob settings. The density at the center indicates many combinations of knob settings fall in the same process space and maps to a certain knob space that may be continuous. This tighter process control window is especially helpful in wafer-to-wafer control during HVM, as is elaborated further below.

Figure 6B:
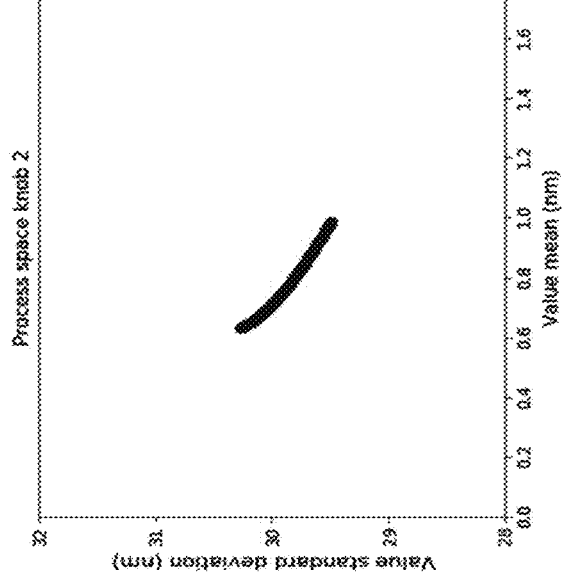
FIG. 6B shows coverage of process space when a second knob is changed, according to an embodiment of this disclosure.
Figure 6A:
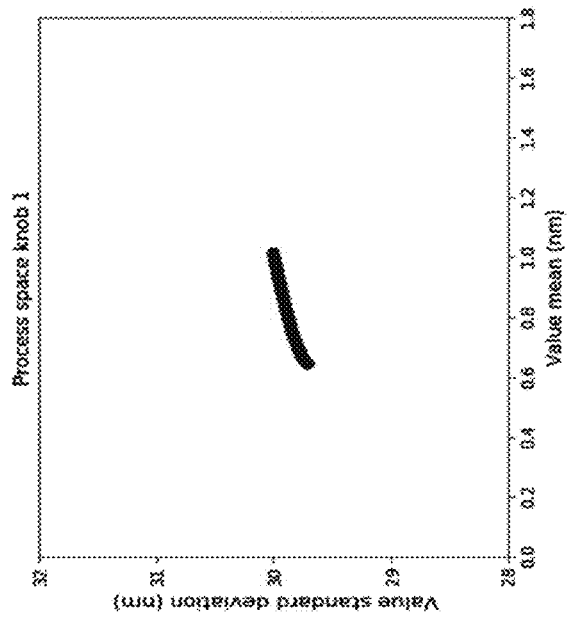
FIG. 6A shows coverage of process space when a first knob is changed, according to an embodiment of this disclosure.
Figure 6C:
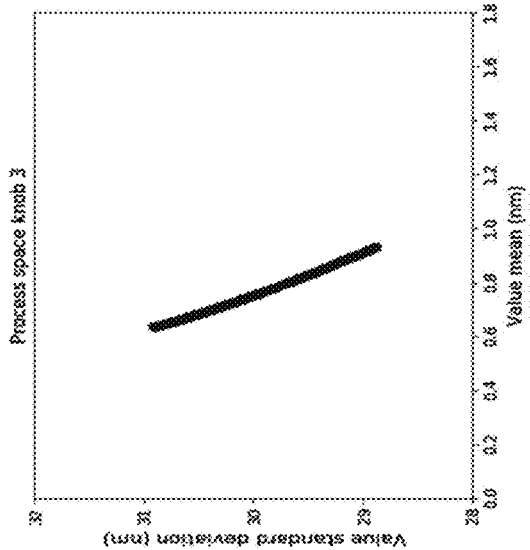
FIG. 6C shows coverage of process space when a third knob is changed, according to an embodiment of this disclosure.

FIG. 6A shows coverage of process space when a single knob (a first knob) is changed, i.e. a single process variable is changed. FIG. 6B shows coverage of process space when a different knob (a second knob) is changed, i.e. a different process variable is changed. FIG. 6C shows coverage of process space when yet another knob is changed, i.e. a third knob different from the first knob and the second knob is changed. This is the conventional way of process space exploration where the impact of the two knobs on each other cannot be predicted when both are changed simultaneously, especially when the two knobs are non-orthogonal, which is the case most of the times.

Figure 6E:
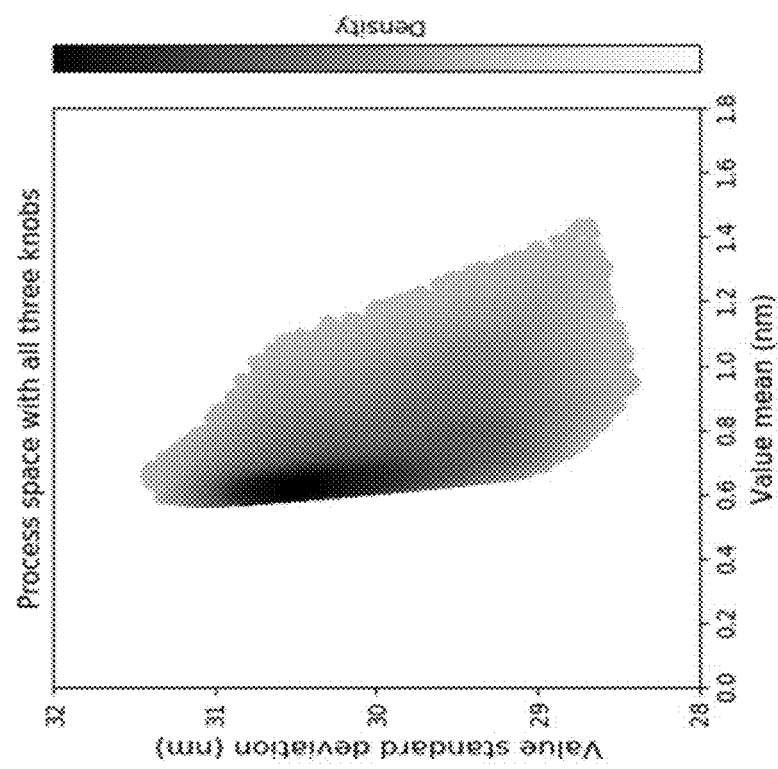
FIG. 6E shows coverage of process space further improves when three non-orthogonal knobs are changed simultaneously, according to an embodiment of this disclosure.
Figure 6D:
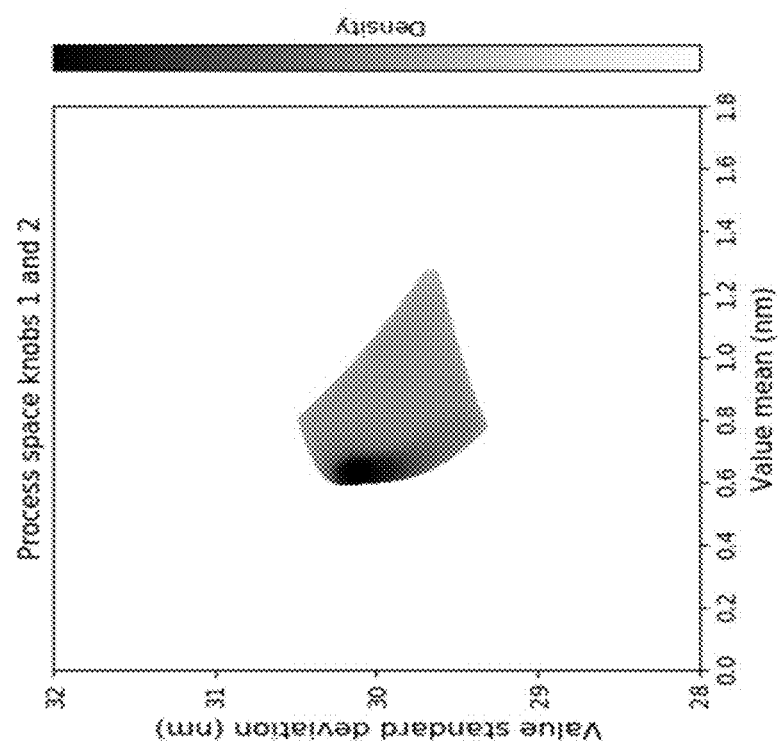
FIG. 6D shows coverage of process space improves when a first and a second non-orthogonal knobs are changed simultaneously, according to an embodiment of this disclosure.

FIG. 6D shows the coverage of process space predicted by the spatial digital DoE model of the present disclosure when two non-orthogonal process variables (e.g., a first knob and a second knob discussed above) are simultaneously changed. FIG. 6E shows the coverage of process space predicted by the spatial digital DoE model of the present disclosure when three non-orthogonal process variables (e.g., a first knob, a second knob and a third knob discussed above) are simultaneously changed. Tighter dimensional control can be achieved if the process variation is confined within the darker central part of the covered process space, the lighter to darker shades representing lower to higher density, as shown in the accompanying density bars in FIGS. 5B, 6D and 6E.

Figure 7A:
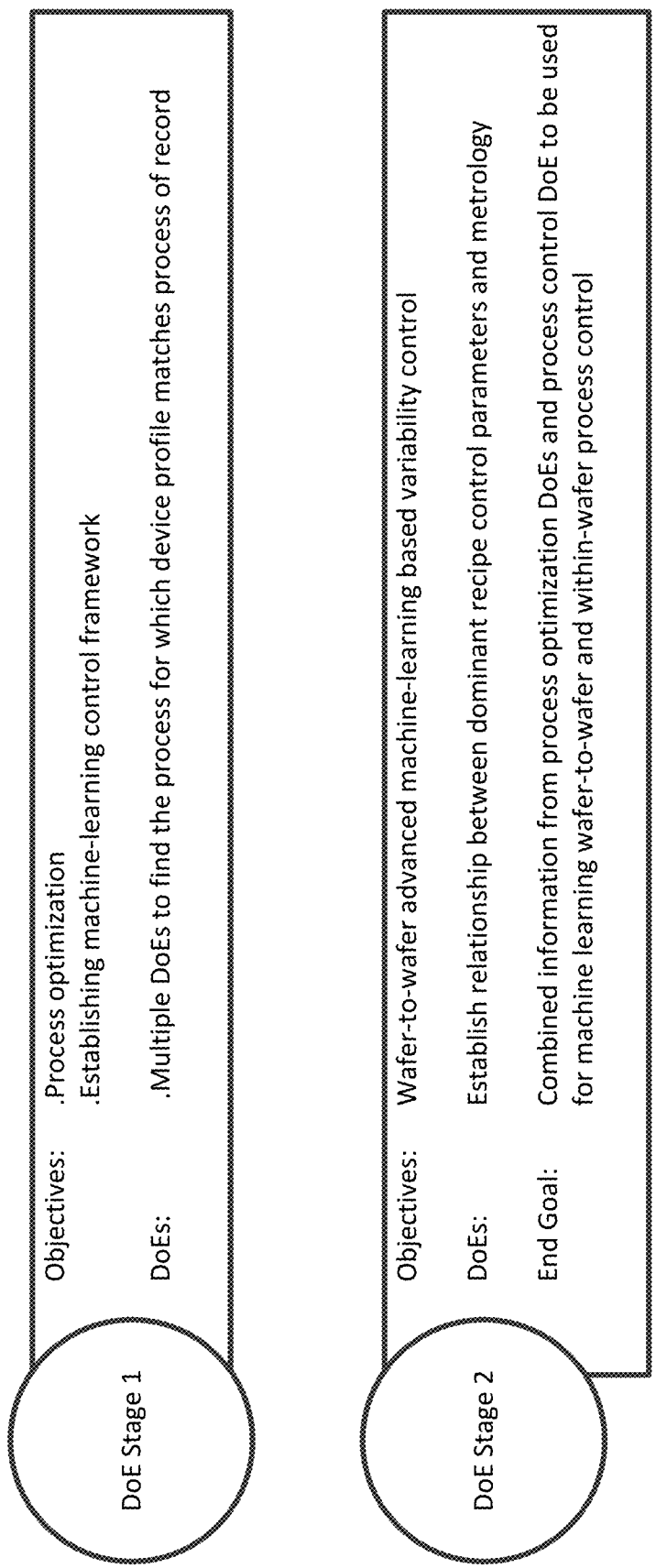
FIG. 7A shows DoEs during process optimization and process control, respectively, in accordance with an embodiment of the present disclosure.

FIG. 7A shows two stages of DoE during the process development stage. The objective of the first stage of DoE (DoE Stage 1, also referred to as process optimization DoE) is to optimize the process and to establish a machine-learning control framework. Example of DoE processes may include but are not limited to an etch process for tapered bottom profile in a device structure to match process of record (POR) for wafer acceptance test (WAT). The first stage of DoE may also help identify which process steps are sensitive to specific knob (e.g., RF power, temperature, gas etc.) variation or other process parameter variation.

The objective of the second stage of DoE (DoE stage 2, also referred to as process control DoE) is advanced machine-learning based wafer-to-wafer variability control, as described below. DoE stage 2 aims to establish relationship between dominant recipe control parameters and various types of metrology (e.g., VM, OBM, SEM-based in-line metrology etc.). The end goal is to use the combined information from the process optimization DoEs and the process control DoEs for wafer-to-wafer and within-wafer process control using machine-learning techniques.

Adaptive Modeling for Tighter Process Control

The spatial model discussed above generates spatial profile across a wafer. For tight device specifications (e.g., 5 nm technology and beyond), feature-level 3D spatial profiling accuracy requirement becomes very challenging. There is a need for tighter control of process from one wafer to another during high volume manufacturing in order to meet the dimensional accuracy requirement. In case of multiple chambers distributed within one processing equipment or multiple processing equipments across a fabrication platform, chamber matching is important to minimize process variation between wafers due to hardware variation that results in device dimension variation that is correlated with device performance variation.

Presently, the primary focus in process control is lot-to-lot control rather than wafer-to-wafer control within a lot. Inventors of the present disclosure recognize that temporal changes due to chamber condition drift, chamber wall changes and degradation of consumable parts over time may introduce device performance variation between wafers even within a single lot. Within a multi-chamber fabrication platform, the process control ecosystem requires big-data-analytics based process control model for advanced chamber matching to minimize wafer-to-wafer device performance variability.

Presently monitoring of chambers is done using either of virtual metrology, on-board metrology, in-line metrology, or device parametric and yield test that requires special electrical test set-up. Each technique has its pros and cons. For example, virtual metrology (VM) is temporally closest to the device processing cycle time, as data is available in-real time from sensors within the chamber. On-board metrology (OBM) is also temporally quite close to the processing cycle. However, VM and OBM data has limited direct correlation with device performance. Therefore, if only VM and OBM data is used as input to a device performance prediction model, then the model's accuracy might be compromised.

The ultimate test for device performance is obtained at the end of a process step (or several process steps, such as, litho, deposition, etch, clean etc.) through electrical test. Electrical test data, such as threshold voltage, leakage current etc., is highly correlated to feature-level dimensions on the wafer. However, this test data is only available after a process step (or several process steps) is completed, depending on at which stage of device processing the electrical test is being performed, i.e. whether the electrical test is front-end-of-line (FEOL), middle-end-of-line (MEOL), or back-end-of-line (BEOL) test. The DoEs of the present disclosure can be customized to FEOL DoE, MEOL DoE or BEOL DoE. The timeframe for obtaining electrical test data can be a few weeks or a couple of months from front to back.

Figure 7B:
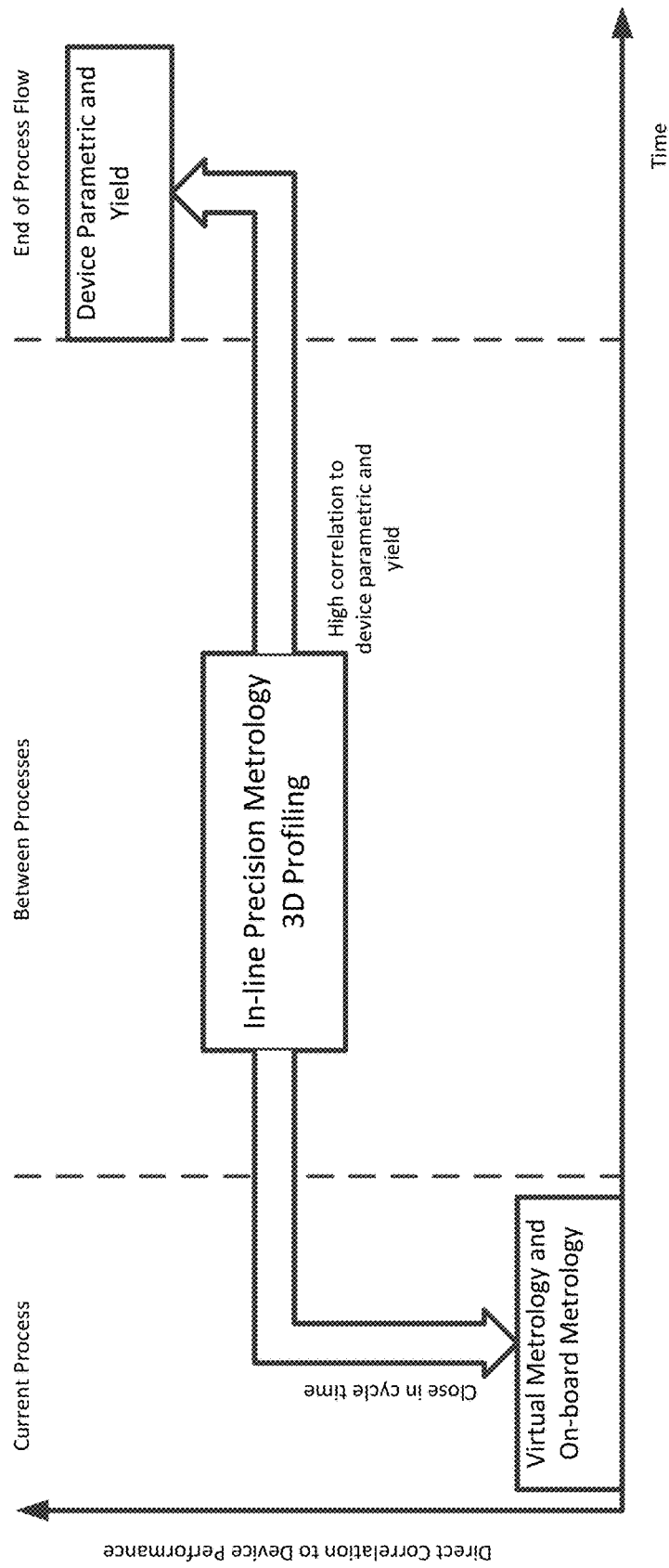
FIG. 7B shows correlation between various test and measurement techniques and device performance, in accordance with embodiments of the present disclosure.

This disclosure recognizes that precision in-line metrology, performed closer to real process cycle time than waiting for electrical test results at the end of a process flow, can be used to update a model to make it well-correlated to real device performance. In-line metrology, such as e-beam inspection and metrology, can provide a good compromise between accuracy of data (i.e. how well-correlated the metrology data is with the device performance) and proximity to cycle time. For example, precision SEM metrology (sometimes referred to as customized metrology) providing feature-level 3D profile information has much better correlation with device performance compared to the correlation obtained from only VM and OBM. While OBM and VM data is available for any current process step, SEM metrology data can be obtained in between process steps. Moreover, in-line metrology data can be collected much closer in cycle time in a process cycle (though proximity to cycle time is lower than VM and OBM) rather than having to wait for the infrequent electrical test data (device parametric and yield data) obtained at the end of each process cycle. FIG. 7B summarizes the above-described varied correlation between type of measurement and device performance.

Despite the above advantages, in-line metrology is currently performed between wafer lots, rather than between wafers in a single lot. The present disclosure describes how the massive 3D profiling metrology data (customized metrology) obtained by in-line metrology tool is utilized to adapt the machine-learning-based process model described herein for better wafer-to-wafer control.

Figure 7C:
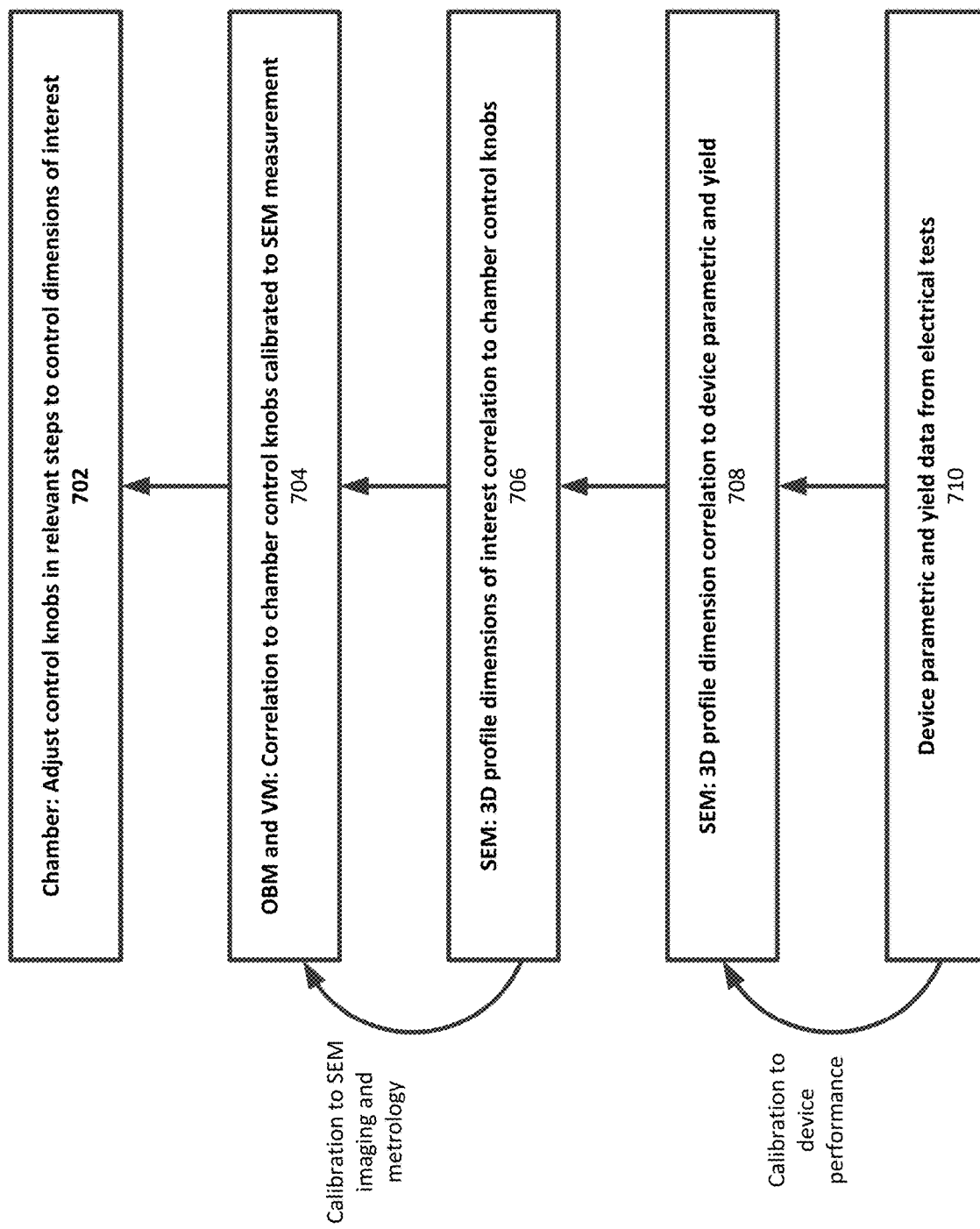
FIG. 7C shows how an empirical spatial model, which is the foundation for process optimization and control, can be calibrated to both device performance and in-line metrology, in accordance with an embodiment of the present disclosure.

FIG. 7C shows how an empirical spatial model, which is the foundation for process optimization and control, can be calibrated to both device performance and in-line metrology (e.g., SEM) data. Once device parametric and yield data from electrical tests are available (block 710), the model is calibrated to device performance, and 3D profile dimensions measured by the SEM are correlated to device performance by using the parametric and yield data (block 708). The calibration to device performance may be set to per periodic maintenance or any other suitable periodicity. 3D profile dimensions of interest are also correlated to chamber control knobs (block 706). The model is calibrated using SEM imaging and metrology data obtained on dimensions of interest per wafer or per lot, which in turn is calibrated to device performance. Thus, the correlation of process control knobs based on OBM and VM data is further refined in block 704 to improve overall correlation with device performance. Ultimately, the model helps in adjusting the control knobs of the chamber in relevant steps to control dimensions of interest (block 702).

Figure 7D:
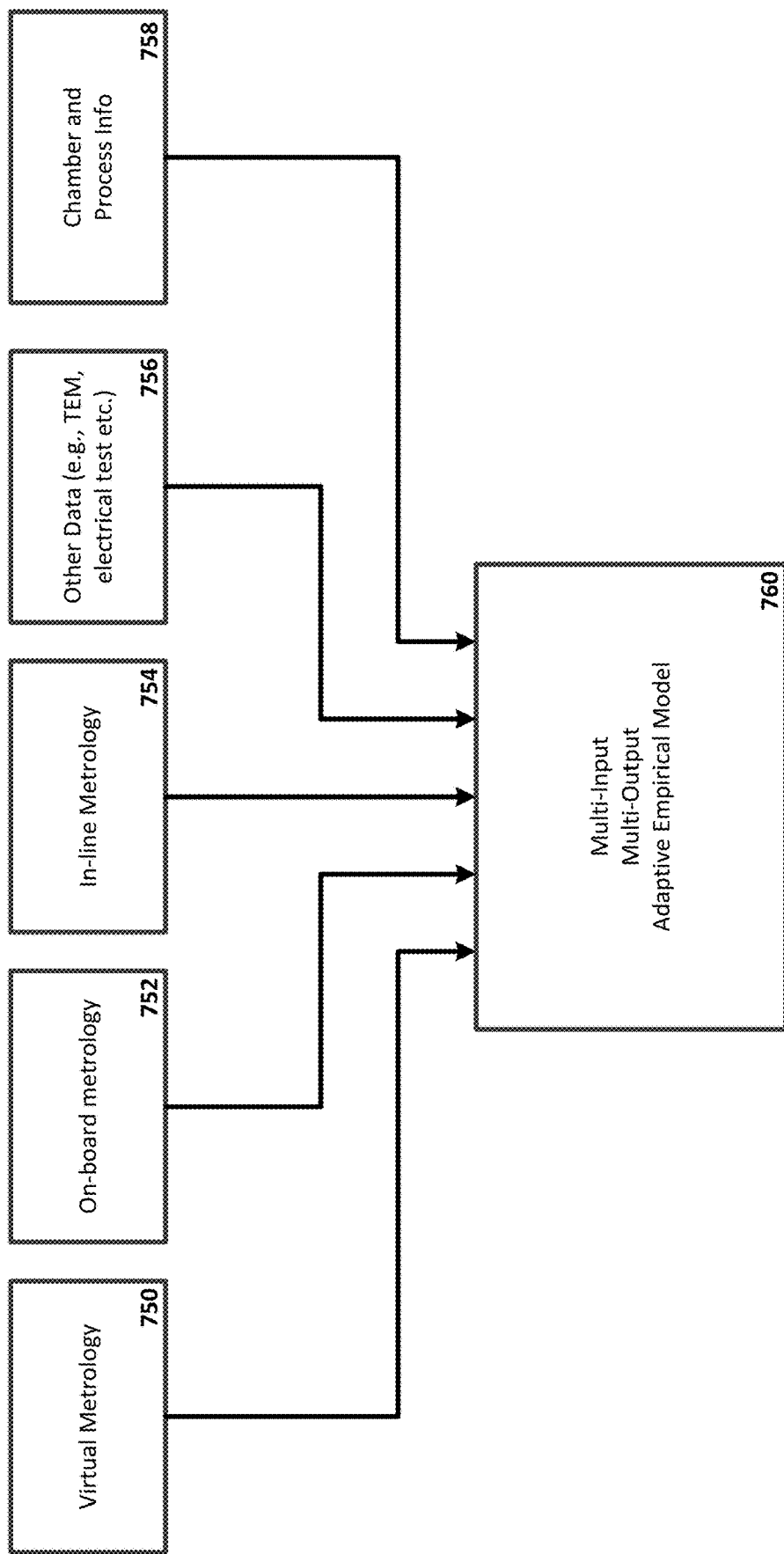
FIG. 7D shows the different inputs used in an adaptive version of the machine-learning based model, according to an embodiment of this disclosure.
Figure 7E:
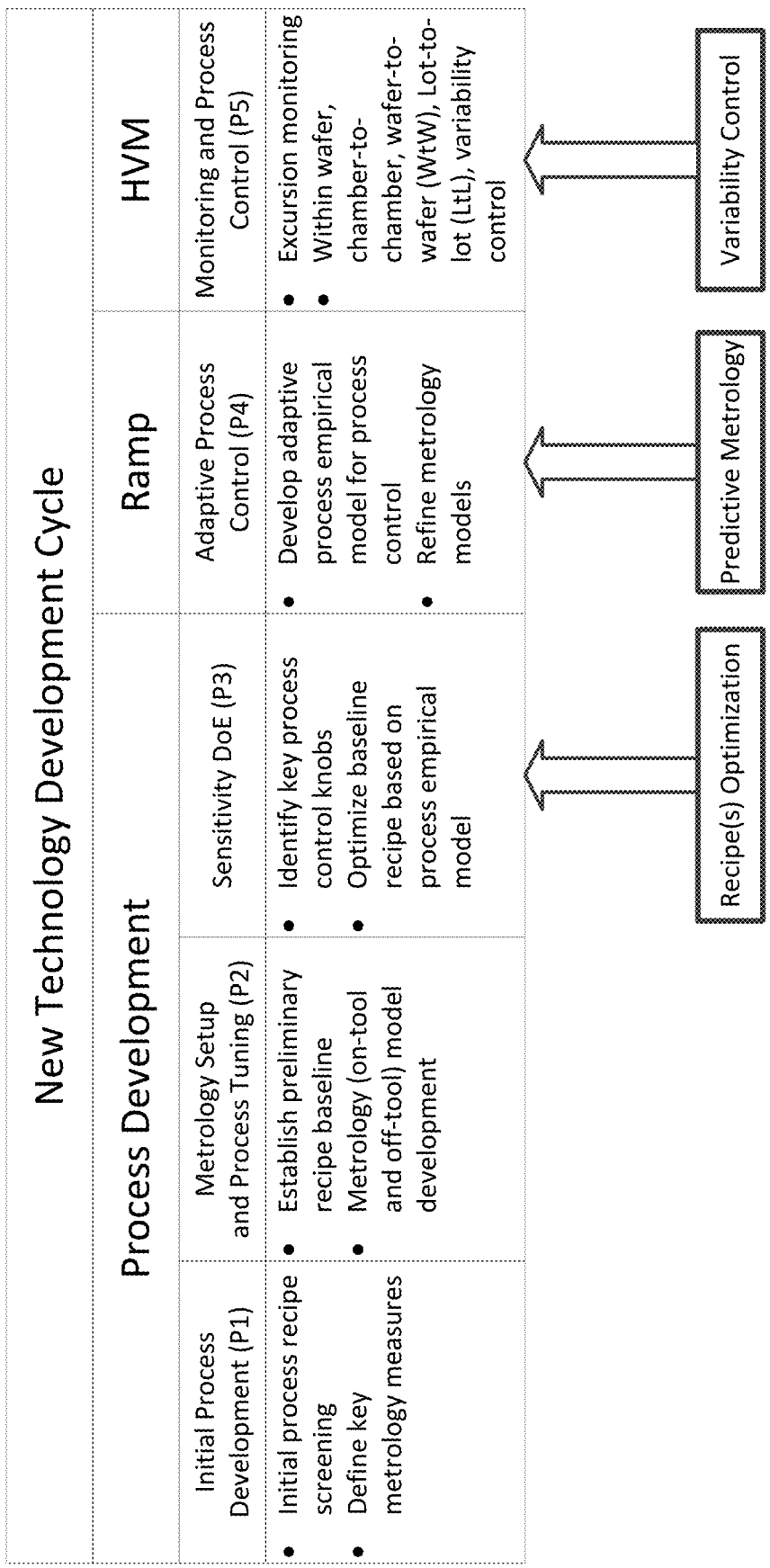
FIG. 7E shows a new technology development cycle using the machine-learning based empirical model, in accordance with an embodiment of the present disclosure.

FIG. 7D shows various information utilized to create a multi-input multi-output adaptive empirical process control model 760 (also referred to as "adaptive model"). "Multi-input" refers to metrology data about various dimensions of interest, and "multi-output" refers to various spatial profiles predicted by the model. To implement the adaptive feature, actual DoE wafers are characterized by VM data (shown as block 750), OBM data (shown as block 752) and in-line metrology data (shown as block 754). Other data (shown as block 756), such as TEM data, data available from customers or other sources, device parametric and yield data from the electrical test, may also be fed to the model. In addition, chamber information and process information (shown collectively as block 758) are used to create the adaptive model. An example of process information 758 may be a plasma based process model available for a certain chamber. Chamber information and process information may vary, and can be retrieved from a database that contains information about various chambers and various processes. The in-line metrology data may be given higher priority than VM and/or OBM data in calibrating the adaptive model because of better correlation of in-line metrology data with the device performance, as discussed above. If device parametric data (electrical test data) is available from similar devices, that data is also used. The adaptive model correlates between the critical knobs as identified in the DoE and the metrology output. Once established and calibrated, the adaptive model can be used for wafer-to-wafer control of device performance variability utilizing VM and OBM as input for the model without the need to collect in-line metrology data at least for a certain period. FIG. 7E shows a new technology development cycle using the machine-learning based empirical model. The cycle can be divided into three stages along the time scale: process development stage, ramp stage and high volume manufacturing (HVM) stage. The process development stage can be sub-divided into three phases: initial process development phase (P1), metrology set-up and process tuning phase (P2), and sensitivity DoE phase (P3). The ramp stage comprises the adaptive control phase (P4), and the HVM stage comprises the monitoring and process control phase (P5).

Each phase is associated with a number of objectives and functions. For example, P1 is associated with, among other things, initial process recipe screening, and defining key metrology measures. P2 is associated with, among other things, establishing preliminary recipe baseline and developing metrology models (such as OBM and SEM) and optimizing the metrology precision and accuracy. P3 is associated with, among other things, identifying key process control knobs, and optimizing baseline recipe based on the empirical model. P4 is associated with developing adaptive version of the empirical model for process control, and refining the metrology models based on calibration to device performance data. This phase uses predictive metrology P5 is primarily associated with excursion monitoring, and closed loop process control (e.g., within wafer, wafer-to-wafer, lot-to-lot, chamber-to-chamber variability control).

Figure 8:
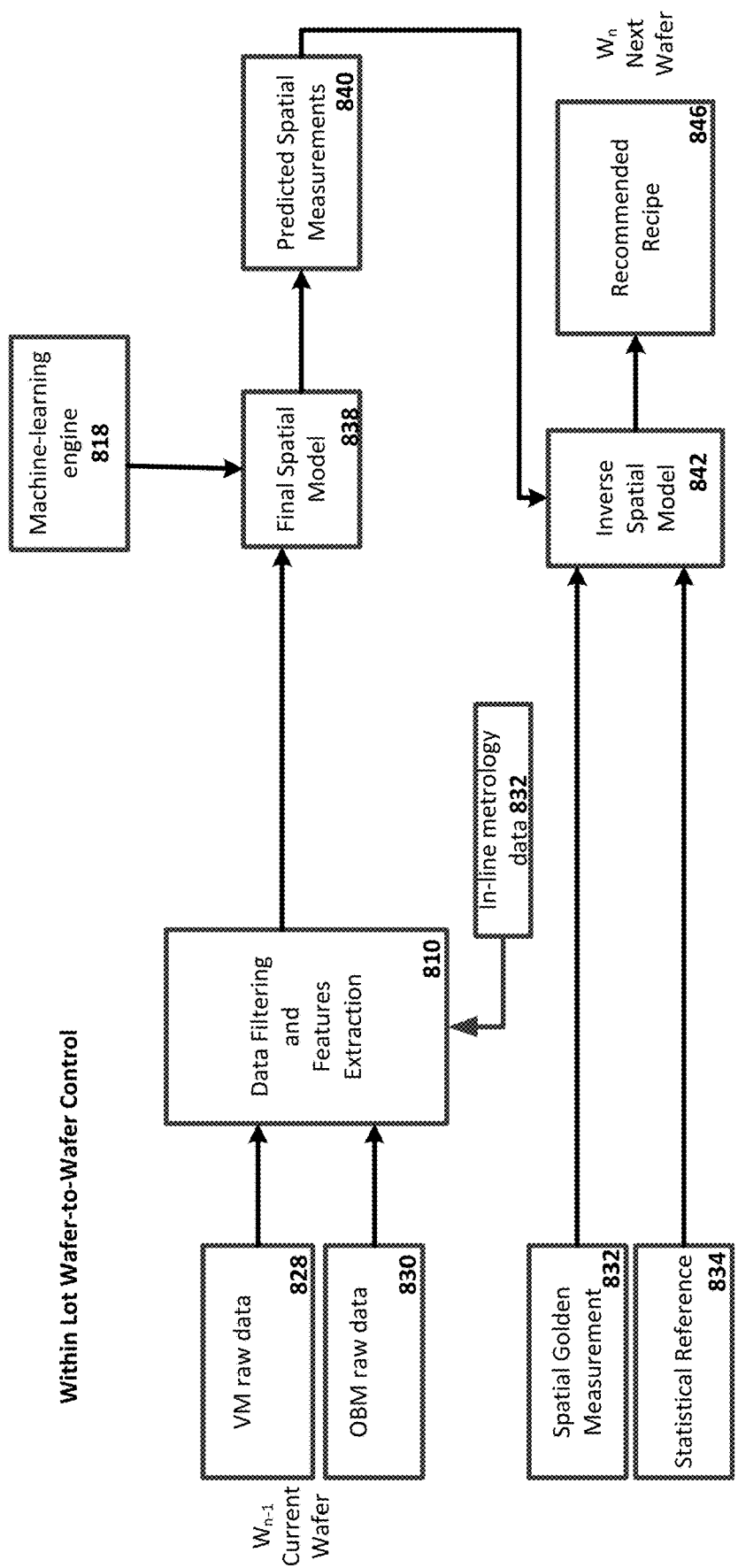
FIG. 8 shows application of the model for wafer-to-wafer process control, according to an embodiment of the present disclosure.

FIG. 8 shows a block diagram of use of the adaptive model for within-lot wafer-to-wafer device performance variability control. The adaptive model uses the final spatial model 838 obtained from the machine-learning engine 818 trained with actual and digital DoE based metrology data.

VM (block 828) and OBM (block 830) raw data from a current wafer ($W_{n-1}$) is fed to a data filtering and feature extraction module 836. Every lot, a few wafers are sampled to go to the in-line metrology tool, and based on the data collected from in-line metrology (block 832), the model 838 is adaptively adjusted. Periodically (e.g., for every periodic maintenance cycle or other preset time periods) the profiling requirements may be adjusted based on available electrical test results. At block 840, spatial measurement results are generated for a recipe, which may be the process-of-record used for the current wafer. The predicted spatial measurements 840 are compared with some spatial golden measurement (block 832) and/or statistical reference (block 834) using the inverse spatial model in block 842. The output of the inverse spatial model is to recommend an adjusted recipe (block 846) for the next wafer (We) within the same lot.

Figure 9:
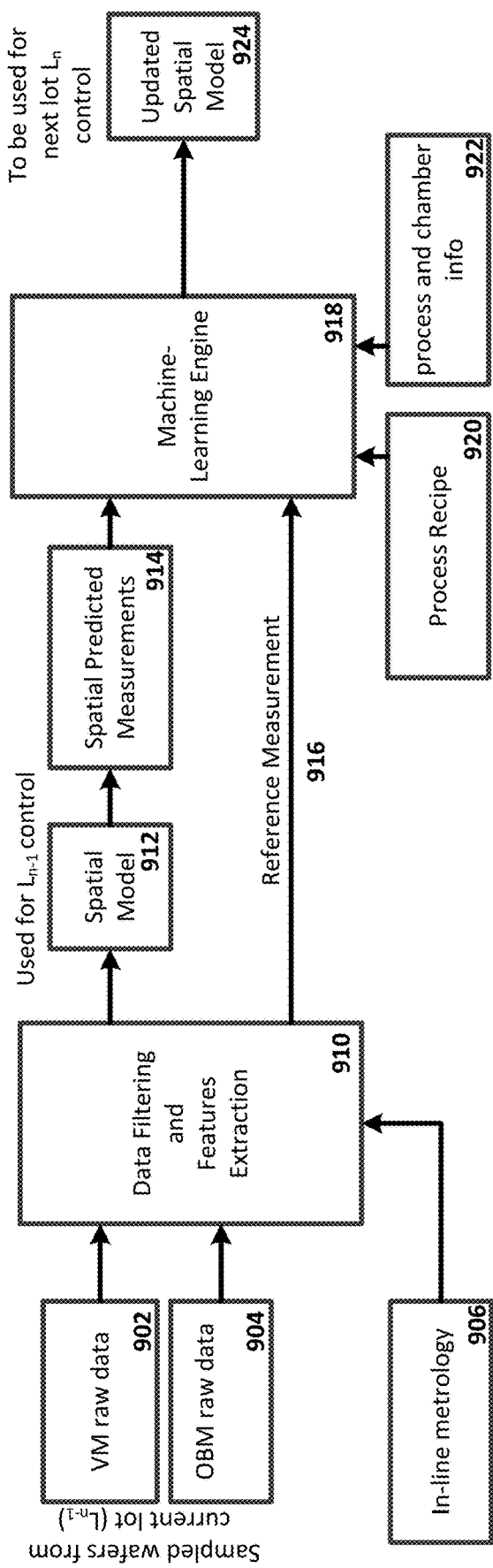
FIG. 9 shows adaptive extension of the model for periodic updating, including but not limited to lot-to-lot updating, according to an embodiment of the present disclosure.

FIG. 9 shows how to adaptively adjust the wafer-to-wafer control model after each lot. Specifically, FIG. 9 shows a block diagram representing the adaptive process for model update. In block 902 and 904, VM raw data and OBM raw data respectively, are collected from the one or more samples of the current lot of wafers ($L_{n-1}$). In-line metrology data is collected for the current lot in block 906 by sampling a few wafers in the current lot. All the collected data goes through the data filtering and features extraction module 910. The spatial model 912 creates a spatial predicted measurement 914, which is fed to the machine-learning engine 918. The machine-learning engine 918 compares predictive measurement to a reference measurement 916 provided by in-line or other off-tool metrology. Process recipe 920 and process and equipment information 922 are provided to the machine-learning engine. An updated spatial model is created in block 924 to be used for controlling the next lot ($L_n$). A process similar to the process shown in the block diagram of FIG. 8 is used to recommend a recipe for the next lot ($L_n$).

The machine-learning engine 818 shown in FIGS. 8 and 918 shown in FIG. 9 may be the same processor shown in the system 100 of FIG. 1B, or may be part of a different control system. Similarly, the data filtering and features extraction module 810 and 910 may be part of the system 100 or part of a different control system.

In addition to improving wafer-to-wafer (and/or lot-to-lot) device performance variability control, integrating in-line metrology data to the adaptive model allows process engineers to understand potential points of failure. VM and OBM are used to qualitatively provide a spatial map of the dimension of interest, which is then compared to a golden reference to identify potential points of failure. Selected wafers are then taken to the in-line metrology tool (such as e-beam for customized metrology) and the areas of interest where the potential failure sites are identified are scanned in detail to identify the root cause of failure.

Figure 10:
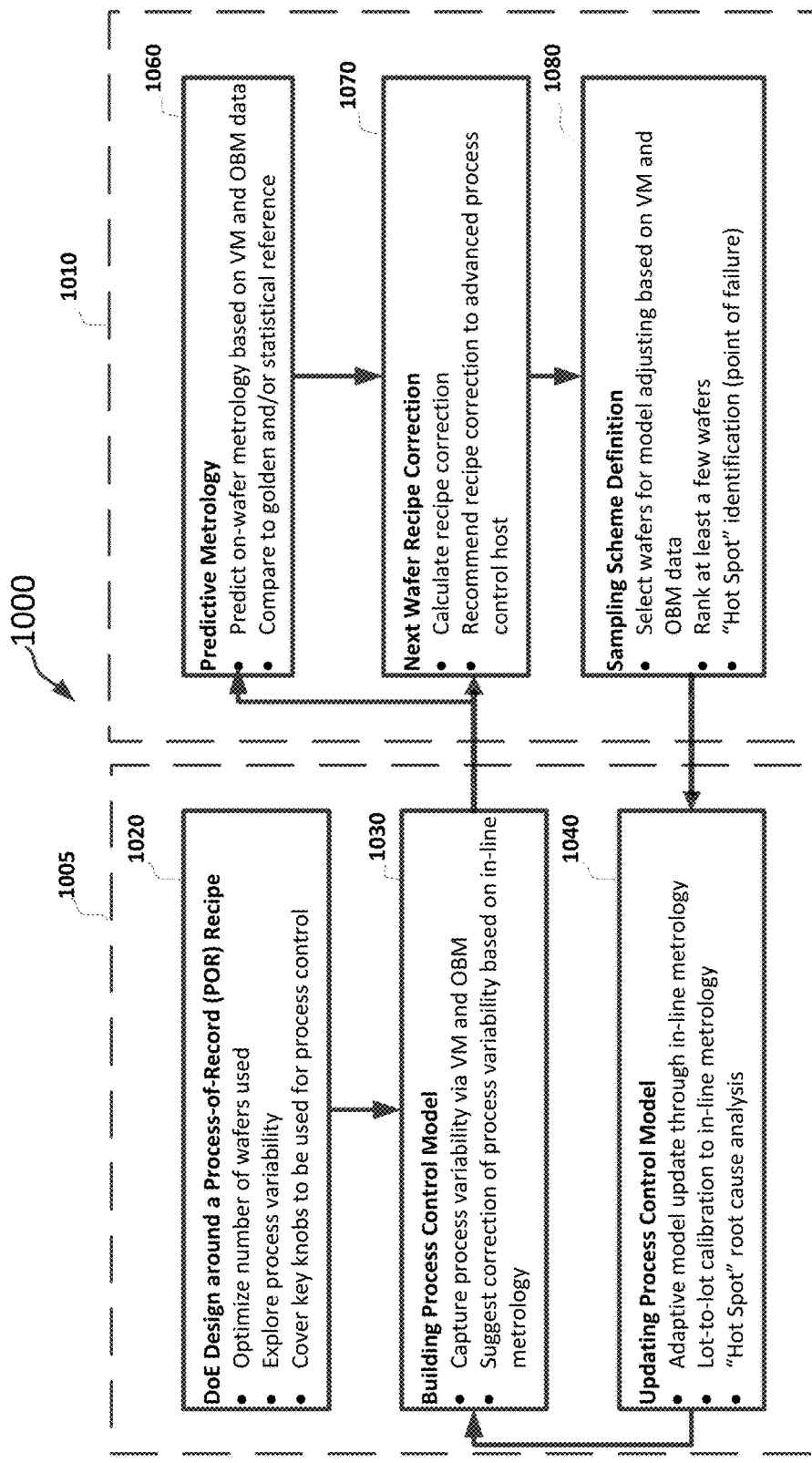
FIG. 10 shows a flow diagram of an example process control method using an adaptive model to maintain tighter process control during high volume manufacturing, in accordance with some embodiments of the present disclosure.

FIG. 10 is a flow diagram of an example method 1000 to enable complementary process control between wafers in a single lot and between lots, in accordance with some embodiments of the present disclosure. The goal of method 1000 is to maintain and tightly control a process during HVM. The method 1000 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the processes in method 1000 or other methods described below with illustrative flowcharts can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

The method 1000 may have two complementary flows, namely, a model-building and updating flow 1005 for the adaptive model and a within-lot run-to-run process control flow 1010. The term "run-to-run" is used to mean from one wafer to the next wafer within a lot. The model-building and updating flow 1005 starts at block 1020, with designing a DoE around a process of record (POR) recipe that was identified during the process optimization (i.e., development and ramping up stage using the spatial digital DoE model of this disclosure). In this block, number of actual DoE wafers used for model calibration may be optimized. Process variability is explored for the POR recipe. Also, key knobs to be used for process control are identified and the DoE process space is designed to cover at least the key knobs. Next, a process control model is built in block 1030, which captures process variability via VM and OBM, and uses machine-learning engine to suggest process variability correction that may be used for a next set of wafers within a lot. In block 1040, the process control model is updated through in-line metrology data. Lot-to-lot calibration of the process model may be performed. Also, if "hot spots" or points of failures are identified within the run-to-run process control flow 1010 (described below), root cause analysis (RCA) may be performed in block 1040.

The run-to-run process control flow 1010 starts at block 1060, where on-wafer metrology (i.e. spatial map of dimensions of interest) is predicted based on VM and OBM data. The prediction may be compared to golden references and/or statistical references. In block 1070, the suggestion from block 1030 is received and a corrected recipe is calculated for the next wafer run. The recipe correction may be recommended to an advanced process control (APC) host.

At block 1080, a sampling scheme is defined for adjusting the adaptive model at block 1040. A few wafers are selected for model adjustment based on VM and OBM data. Those few wafers may be ranked and one or more top-ranked wafers may be selected as the relevant wafers for sending to in-line metrology. For example, top 3-5 wafers may be sent to in-line metrology, but the number may vary. Hot spots (HS) (or points of failure) may be identified by e-beam inspection or other methods from the wafers that are sent to in-line metrology. Identified hot-spots may be used for RCA to understand any potential point of failure on the wafer, as discussed above. Persons skilled in the art will appreciate that block 1040 may loop back to block 1030 periodically based on the combined insight gained from the VM, OBM and in-line metrology data.

Figure 11:
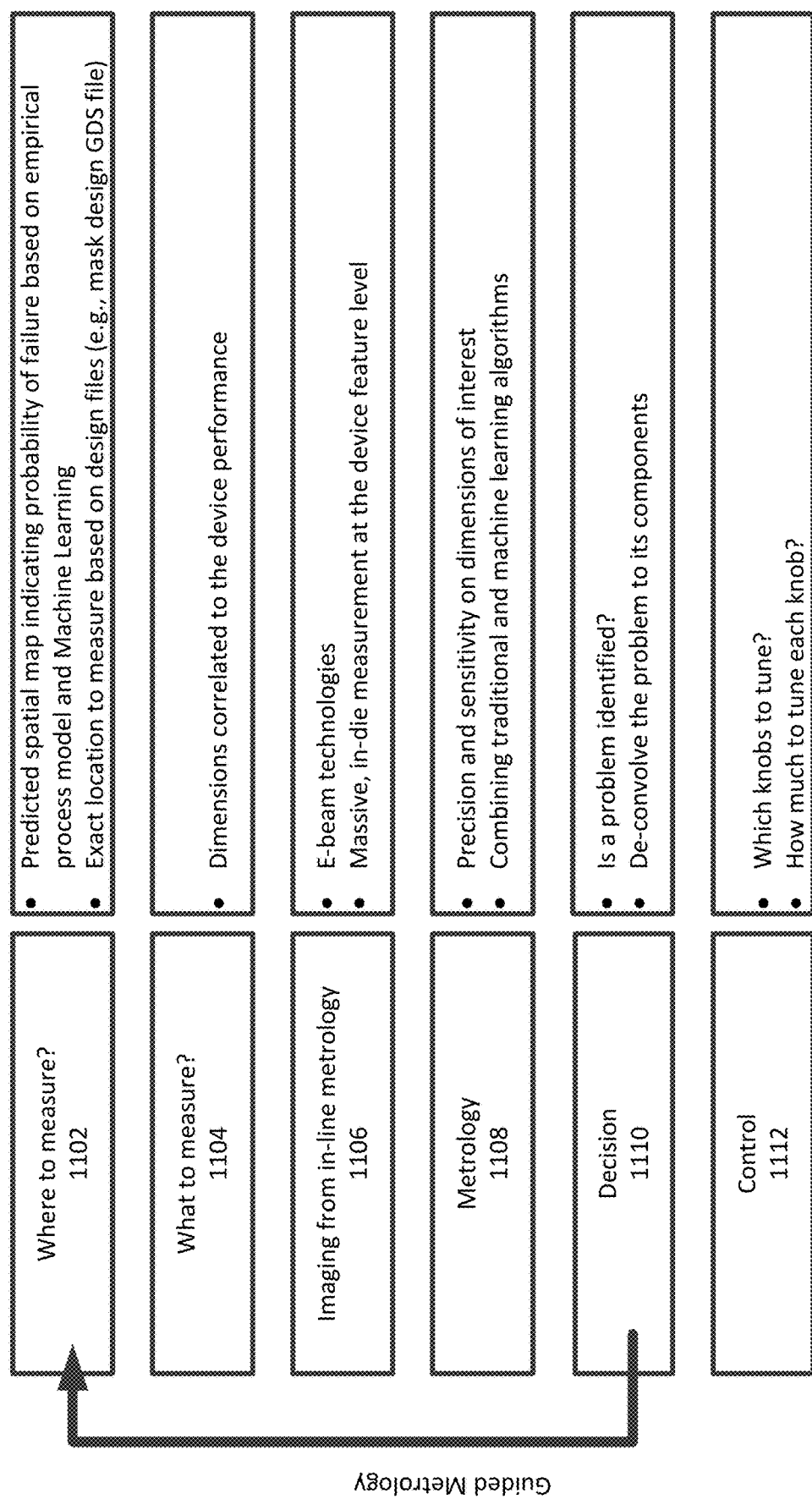
FIG. 11 illustrates key components of variability control using guided metrology, in accordance with an embodiment of the present disclosure.

FIG. 11 illustrates key components of variability control using guided metrology to refine the model, according to embodiments of the present disclosure. The output of the model is a predicted spatial map indicating probability of failure based on the empirical process model and machine-learning. The first block 1102 decides where to measure. i.e., exact locations on the wafer to measure, including the hot spots (or points of failure) on the design files (e.g., mask design GDS file). The block 1104 decides which dimensions are correlated to device performance. In the block 1106, imaging data from massive in-die measurement at the feature-level by advanced e-beam technology is fed into the spatial model. The block 1108 is a metrology block, where sensitivity on the dimensions of interest is assessed by combining traditional and machine-learning algorithms. The block 1110 is a decision block, where it is identified if there is a problem with a certain process. If a problem is identified, the problem is de-convolved into its components, e.g., which knob settings need to be particularly adjusted to correct the problem. Finally, the block 1112 is a control block, where based on machine-learning models, it is decided which knobs to tune and how much to tune each knob. In summary, guided metrology links the functional blocks described in FIG. 11 to detect hot spots (or points of failure) and to refine the process to avoid hot spots or to mitigate failure.

System Environment

Figure 12:
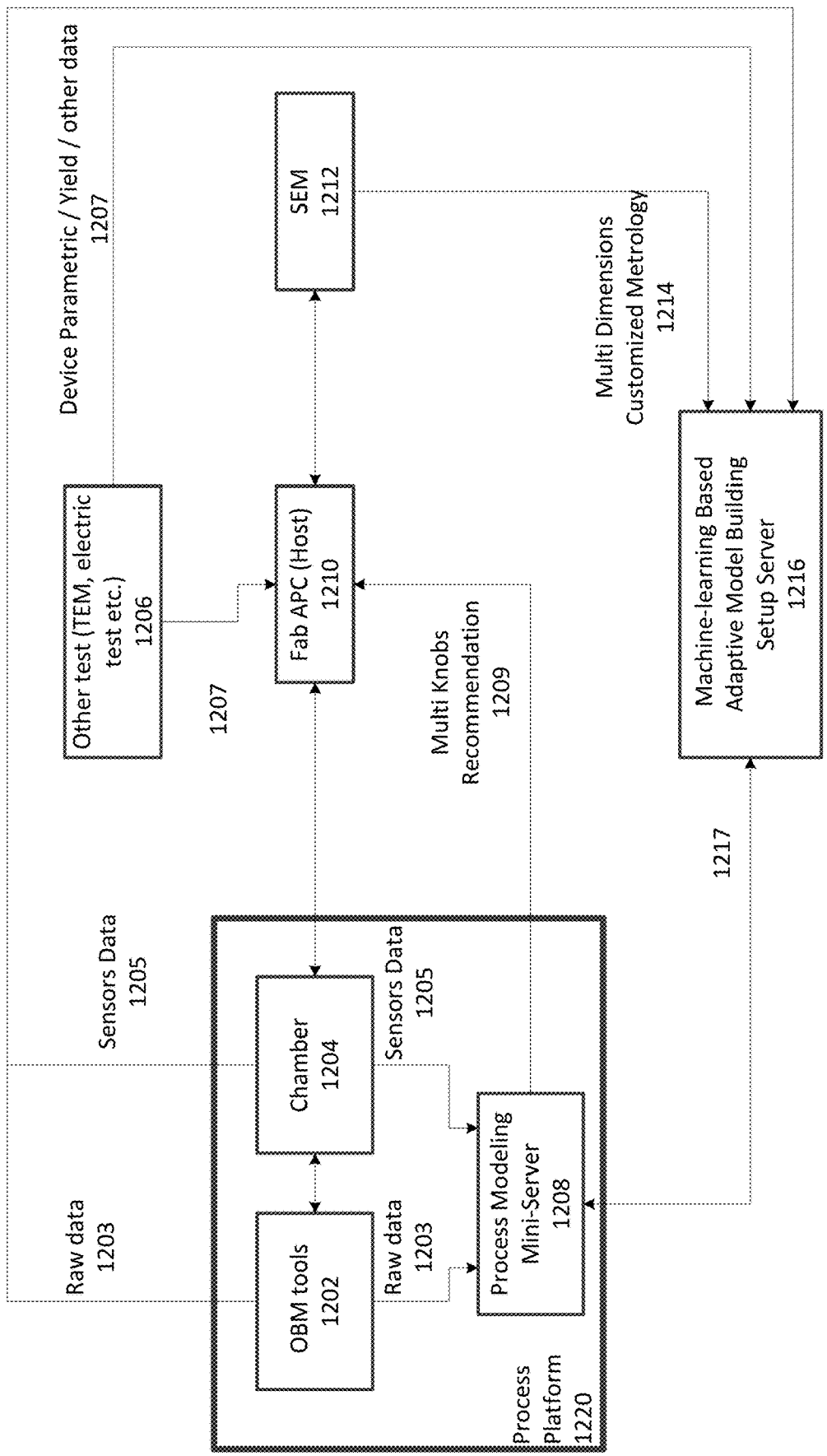
FIG. 12 shows a technical architecture block diagram for variability control, in accordance with an embodiment of the present disclosure.

FIG. 12 shows a technical architecture block diagram showing a single chamber for simplicity of illustrations, though persons skilled in the art would appreciate that multiple chambers may be part of a single platform. The process platform 1220 has a process modeling mini-server 1208, which receives sensors data 1205 (i.e. VM data) from sensors in the chamber 1204, and raw data 1203 (e.g., emission spectra) from OBM tools 1202. Based on VM and OBM, the process modeling mini-server 1208 sends multi-knobs recommendation 1209 (as calculated using the spatial model) to the fab advanced process controller (APC) in the host computer 1210. The fab APC 1210 also receives data 1207 from other test tools, such as TEM, electrical test tool etc. The electrical test data may include device parametric and yield data. The Fab APC 1210 also receives in-line precision metrology data from SEM 1212, which produces multi-dimension customized metrology data 1214. The machine-learning-based model building set-up server 1216 receives customized metrology data 1214, TEM and other device parametric and yield data 1207, raw OBM data 1203 and sensors data 1205 to adaptively adjust the process model. Machine-learning engines may reside in one or more of the mini-server 1208, Fab APC 1210 and set-up server 1216. The process modeling mini-server 1208 and machine-learning based model building set-up server 1216 are coupled to each other via the link 1217 so that the spatial model generated by the process modeling mini-server 1208 may be adapted for wafer-to-wafer or lot-to-lot variation control using the massive in-line metrology data from SEM 1212, as needed.

Figure 13:
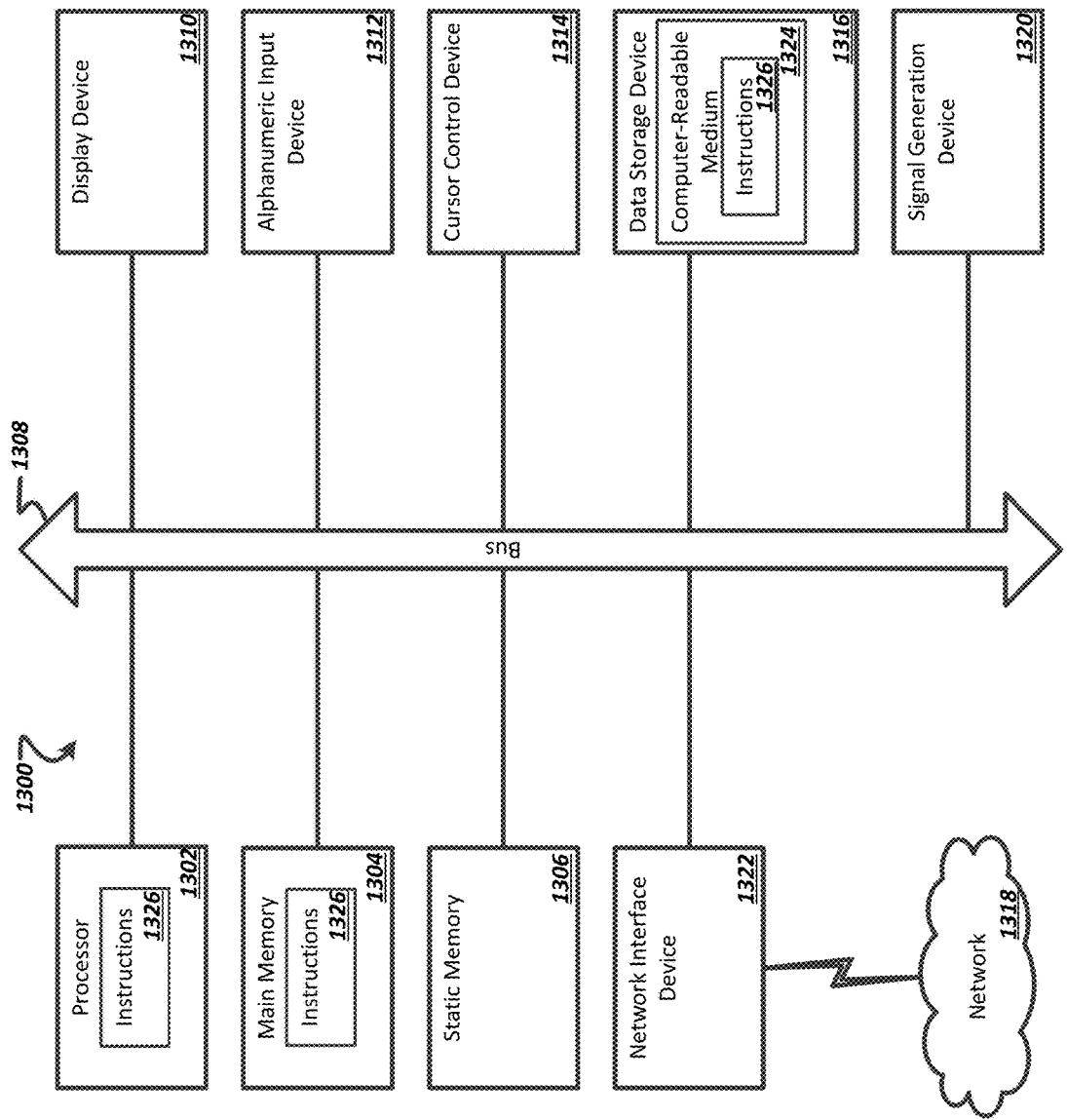
FIG. 13 shows a simplified environment within which the methods and systems of the present disclosure may be implemented.

FIG. 13 illustrates an example machine of a computer system 1300 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1300 includes a processing device 1302, a main memory 1304 (e.g., read-only memory (ROM), flash memory, dynamic random access memory (DRAM) such as synchronous DRAM (SDRAM) etc.), a static memory 1306 (e.g., flash memory, static random access memory (SRAM), etc.), and a data storage device 1316, which communicate with each other via a bus 1308.

Processing device 1302 represents one or more general-purpose processing devices such as a microprocessor, a central processing unit, or the like. More particularly, the processing device may be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device 1302 may also be one or more special-purpose processing devices such as an application specific integrated circuit (ASIC), a field programmable gate array (FPGA), a digital signal processor (DSP), network processor, or the like. The processing device 1302 is configured to execute instructions for performing the operations and steps discussed herein.

The computer system 1300 may further include a network interface device 1322 to communicate over the network 1318. The computer system 1300 also may include a video display unit 1310 (e.g., a liquid crystal display (LCD) or a cathode ray tube (CRT)), an alphanumeric input device 1312 (e.g., a keyboard), a cursor control device 1314 (e.g., a mouse or a touch pad)), a signal generation device 1320 (e.g., a speaker), a graphics processing unit (not shown), video processing unit (not shown), and audio processing unit (not shown).

The data storage device 1316 may include a machine-readable storage medium 1324 (also known as a computer-readable medium) on which is stored one or more sets of instructions or software embodying any one or more of the methodologies or functions described herein. The instructions may also reside, completely or at least partially, within the main memory 1304 and/or within the processing device 1302 during execution thereof by the computer system 1300, the main memory 1304 and the processing device 1302 also constituting machine-readable storage media.

In one implementation, the instructions include instructions to implement functionality corresponding to a height difference determination. While the machine-readable storage medium 624 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "identifying" or "determining" or "executing" or "performing" or "collecting" or "creating" or "sending" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct a more specialized apparatus to perform the method. The structure for a variety of these systems will appear as set forth in the description below. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, implementations of the disclosure have been described with reference to specific example implementations thereof. It will be evident that various modifications may be made thereto without departing from the broader spirit and scope of implementations of the disclosure as set forth in the following claims. The specification and drawings are, accordingly, to be regarded in an illustrative sense rather than a restrictive sense.

What is claimed is:

1. A computer-implemented method for controlling device performance variability between different lots of wafers during manufacturing of a device, the method comprising:
    receiving, from one or more chambers in a processing platform, sensor time trace data associated with a current lot of wafers being processed in the one or more chambers, wherein the time trace data is obtained from one or more sensors;
    receiving in-line metrology data from a subset of processed wafers of the current lot of wafers;
    receiving historic device data related to devices on the current lot of wafers, wherein the historic device data comprises device parametric and yield data produced by electric test from a previous lot of wafers having similar devices;
    receiving process data about a current process of record (POR), wherein process data about the current POR includes data about steps of a current process that have been completed so far on the current lot of wafers;
    receiving chamber characteristic data about the one or more chambers;
    converting the sensor time trace data, the in-line metrology data, the historic device data, the process data about the current POR and the chamber characteristic data about the one or more chambers into current device processing data for the current lot of wafers;
    providing the current device processing data as input to a trained machine-learning model, wherein the trained machine-learning model is calibrated with the in-line metrology data being given higher priority than the sensor time trace data;
    obtaining, from the trained machine-learning model, one or more outputs indicative of predictive data; and
    causing, based on the one or more outputs indicative of the predictive data, performance of one or more corrective actions associated with the one or more chambers and the current POR prior to processing a subsequent lot of wafers, such that device performance variability between different lots of wafers is minimized.

2. The method of claim 1, wherein receiving the in-line metrology data comprises receiving image data generated by a scanning electron microscope in a non-destructive way.

3. The method of claim 1, wherein receiving the historic device data comprises receiving image data produced by transmission electron microscopy (TEM) from a previous lot of wafers.

4. The method of claim 1, wherein the trained machine-learning model comprises a model that outputs an updated spatial model predicting variation of one or more dimensions of interest of a device on a specific lot of wafers being processed using the current POR.

5. The method of claim 4, wherein the predicted variation of one or more dimensions of interest of the device on the specific lot of wafers being processed using the current POR corresponds to the chamber characteristics data for the one or more chambers being used to process the current lot of wafers.

6. The method of claim 5, wherein causing performance of one or more corrective actions comprises adjusting of one or more characteristics of the one or more chambers to match the predicted variation of one or more dimensions of interest of the device on the subsequent lot of wafers.

7. The method of claim 6, further comprising:
selecting a specific chamber of the one or more chambers in a multi-chamber platform as a reference chamber for calibrating other chambers of the multi-chamber platform.

8. The method of claim 5, wherein causing performance of one or more corrective actions comprises adjusting one or process parameters of the current POR to match the predicted variation of one or more dimensions of interest of the device on the subsequent lot of wafers.

9. The method of claim 1, wherein the subset of processed wafers is selected by sampling wafers from successive lots based on a predefined sampling scheme.

10. The method of claim 9, wherein the predefined sampling scheme further comprises ranking individual wafers in the subset of processed wafers based on identified hot spots or points of failure.

11. A system comprising:
a processing platform comprising one or more chambers; and
a server with a processing device coupled to the processing platform; wherein the processing device performs operations comprising:
receiving, from one or more chambers in a processing platform, sensor time trace data associated with a current lot of wafers being processed in the one or more chambers, wherein the time trace data is obtained from one or more sensors;
receiving in-line metrology data from a subset of processed wafers of the current lot of wafers;
receiving historic device data related to devices on the current lot of wafers, wherein the historic device data comprises device parametric and yield data produced by electric test from a previous lot of wafers having similar devices;
receiving process data about a current process of record (POR), wherein process data about the current POR includes data about steps of a current process that have been completed so far on the current lot of wafers;
receiving chamber characteristic data about the one or more chambers;
converting the sensor time trace data, the in-line metrology data, the historic device data, the process data about the current POR and the chamber characteristic data about the one or more chambers into current device processing data for the current lot of wafers;
providing the current device processing data as input to a trained machine-learning model, wherein the trained machine-learning model is calibrated with the in-line metrology data being given higher priority than the sensor time trace data;
obtaining, from the trained machine-learning model, one or more outputs indicative of predictive data; and
causing, based on the one or more outputs indicative of the predictive data, performance of one or more corrective actions associated with the one or more chambers and the current POR prior to processing a subsequent lot of wafers, such that device performance variability between different lots of wafers is minimized.

12. The system of claim 11, wherein receiving the in-line metrology data comprises receiving image data generated by a scanning electron microscope in a non-destructive way.

13. The system of claim 11, wherein receiving the historic device data comprises receiving image data produced by transmission electron microscopy (TEM) from a previous lot of wafers.

14. The system of claim 11, wherein the trained machine-learning model comprises a model that outputs an updated spatial model predicting variation of one or more dimensions of interest of a device on a specific lot of wafers being processed using the current POR.

15. The system of claim 14, wherein the predicted variation of one or more dimensions of interest of the device on the specific lot of wafers being processed using the current POR corresponds to the chamber characteristics data for the one or more chambers being used to process the current lot of wafers.

16. The system of claim 15, wherein causing performance of one or more corrective actions comprises adjusting one or more characteristics of the one or more chambers to match the predicted variation of one or more dimensions of interest of the device on the subsequent lot of wafers.

17. The system of claim 16, further comprising:
selecting a specific chamber of the one or more chambers in a multi-chamber platform as a reference chamber for calibrating other chambers of the multi-chamber platform.

18. The system of claim 15, wherein causing performance of one or more corrective actions comprises adjusting of one or process parameters of the current POR to match the predicted variation of one or more dimensions of interest of the device on the subsequent lot of wafers.

19. The system of claim 11, wherein the subset of processed wafers is selected by sampling wafers from successive lots based on a predefined sampling scheme.

20. The system of claim 19, wherein the predefined sampling scheme further comprises ranking individual wafers in the subset of processed wafers based on identified hot spots or points of failure.

* * * * *